United States Patent
Kim et al.

(10) Patent No.: US 7,728,331 B2
(45) Date of Patent: Jun. 1, 2010

(54) THIN FILM TRANSISTOR PANEL AND MANUFACTURING METHOD THEREOF

(75) Inventors: Bong-Ju Kim, Suwon-si (KR); Chun-Gi You, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 115 days.

(21) Appl. No.: 11/856,489

(22) Filed: Sep. 17, 2007

(65) Prior Publication Data
US 2008/0079010 A1  Apr. 3, 2008

(30) Foreign Application Priority Data
Oct. 2, 2006  (KR) .................... 10-2006-0097401

(51) Int. Cl.
*H01L 29/04* (2006.01)
(52) U.S. Cl. .............................. 257/59; 257/72; 257/88; 257/E33.053; 257/E21.532
(58) Field of Classification Search .................. 257/88, 257/E33.053, E21.532, 72; 438/34
See application file for complete search history.

(56) References Cited

U.S. PATENT DOCUMENTS

| 4,956,680 A * | 9/1990 | Tanaka et al. ................. 257/20 |
| 5,981,972 A | 11/1999 | Kawai et al. |
| 2002/0135293 A1 * | 9/2002 | Aruga ......................... 313/493 |
| 2006/0118788 A1 * | 6/2006 | Park ............................. 257/72 |

FOREIGN PATENT DOCUMENTS

| JP | 06-310533 | 11/1994 |
| JP | 10-031227 | 2/1998 |
| JP | 2001-250958 | 9/2001 |
| JP | 2001-326360 | 11/2001 |
| JP | 2005-302808 | 10/2005 |
| KR | 100204071 | 3/1999 |
| KR | 100237673 | 10/1999 |
| KR | 1020000062816 | 10/2000 |
| KR | 100508022 | 8/2005 |
| KR | 1020060073373 | 6/2006 |
| KR | 1020060073382 | 6/2006 |

* cited by examiner

*Primary Examiner*—Fernando L Toledo
*Assistant Examiner*—Mamadou Diallo
(74) *Attorney, Agent, or Firm*—F. Chau & Associates, LLC

(57) ABSTRACT

A thin film transistor array panel including a substrate, a gate line and a gate-layer signal transmitting line of a gate driving circuit portion formed on the substrate, a gate insulating layer formed on the gate line and the gate-layer signal transmitting line and having a first contact hole exposing a portion of the gate-layer signal transmitting line, a semiconductor layer formed on the gate insulating layer, a data line including a source electrode, and a drain electrode formed on the gate insulating layer and the semiconductor layer, a data-layer signal transmitting line of the gate driving circuit portion formed on the gate insulating layer and connected to the gate-layer signal transmitting line through the first contact hole, a pixel electrode connected to the drain electrode, and a passivation layer formed on the data line, the drain electrode, and the data-layer signal transmitting line of the driving circuit portion. The data line, the drain electrode, and the data-layer signal transmitting line have a triple-layered structure including a lower layer, an intermediate layer, and an upper layer. The lower layer is made of a same layer as the pixel electrode.

7 Claims, 38 Drawing Sheets

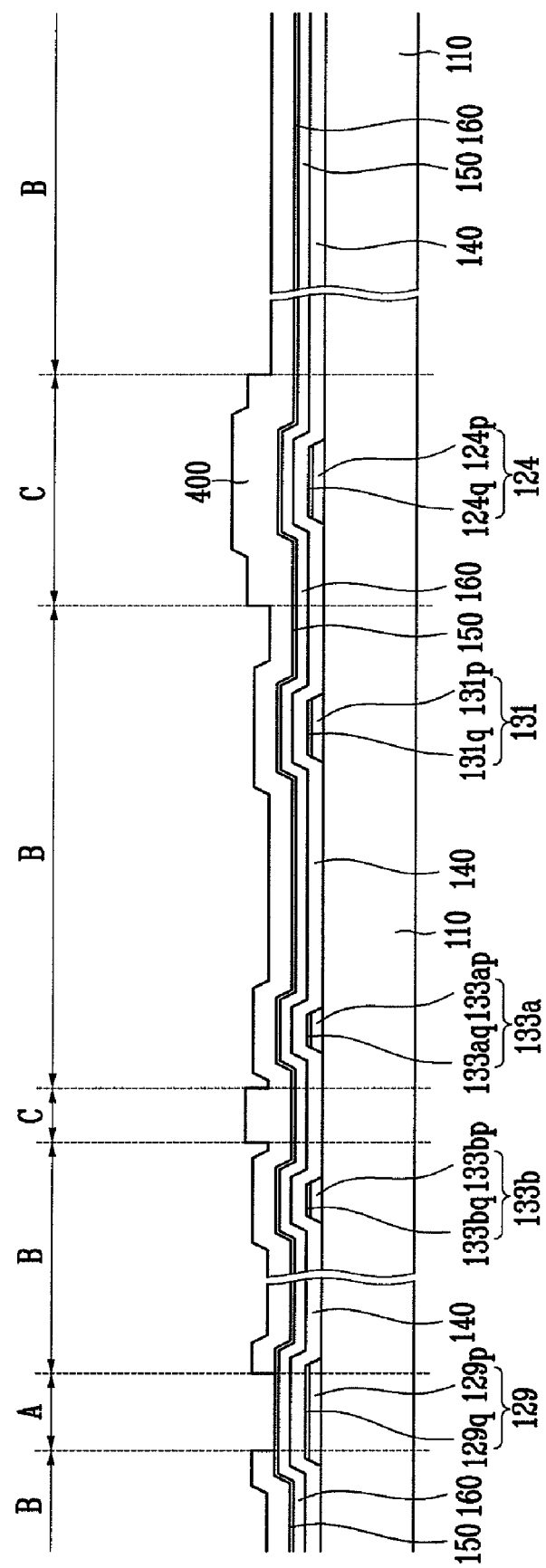

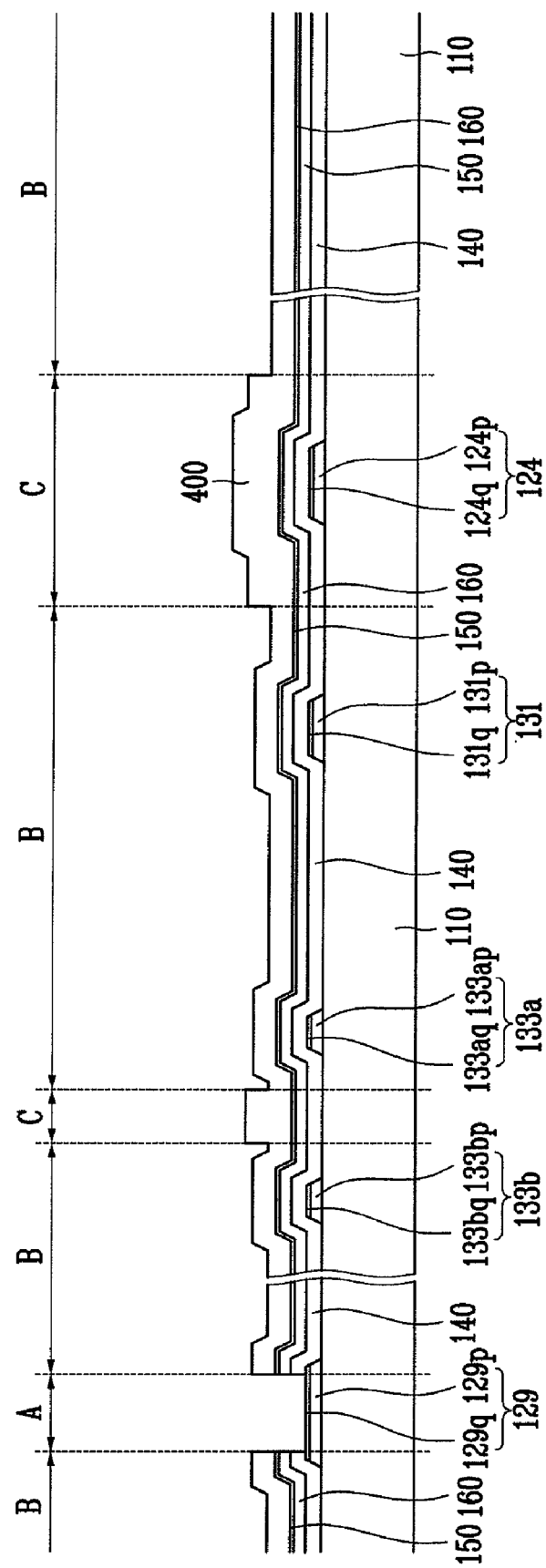

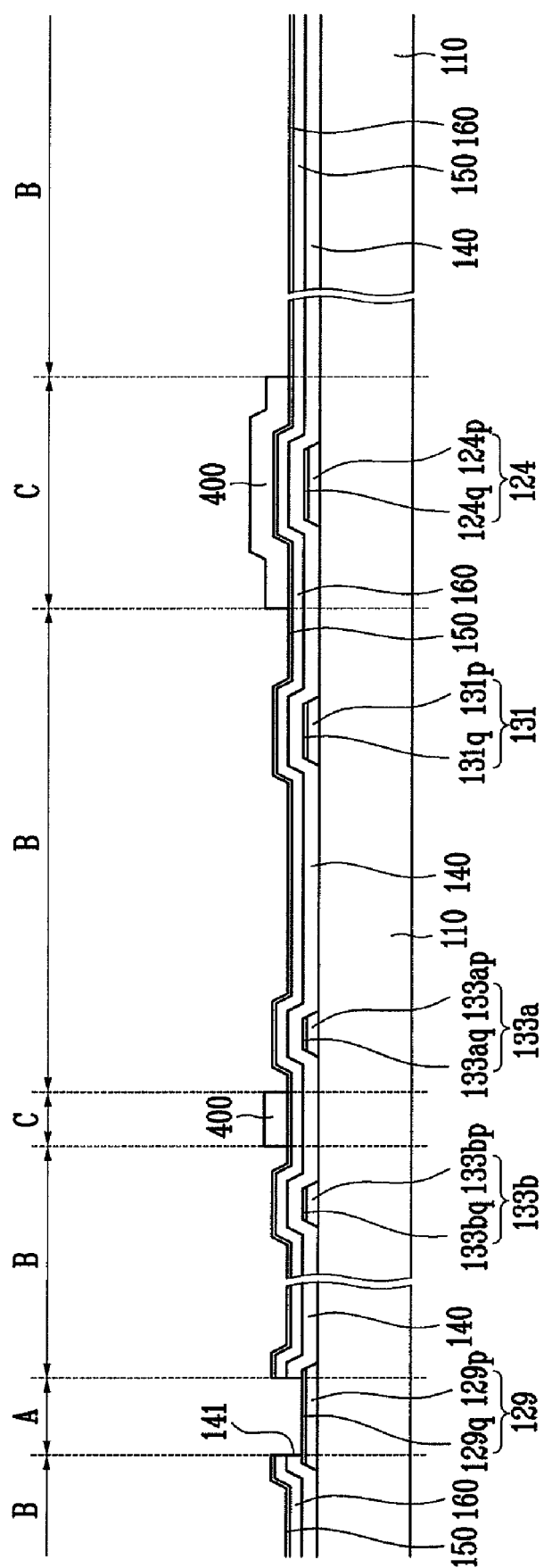

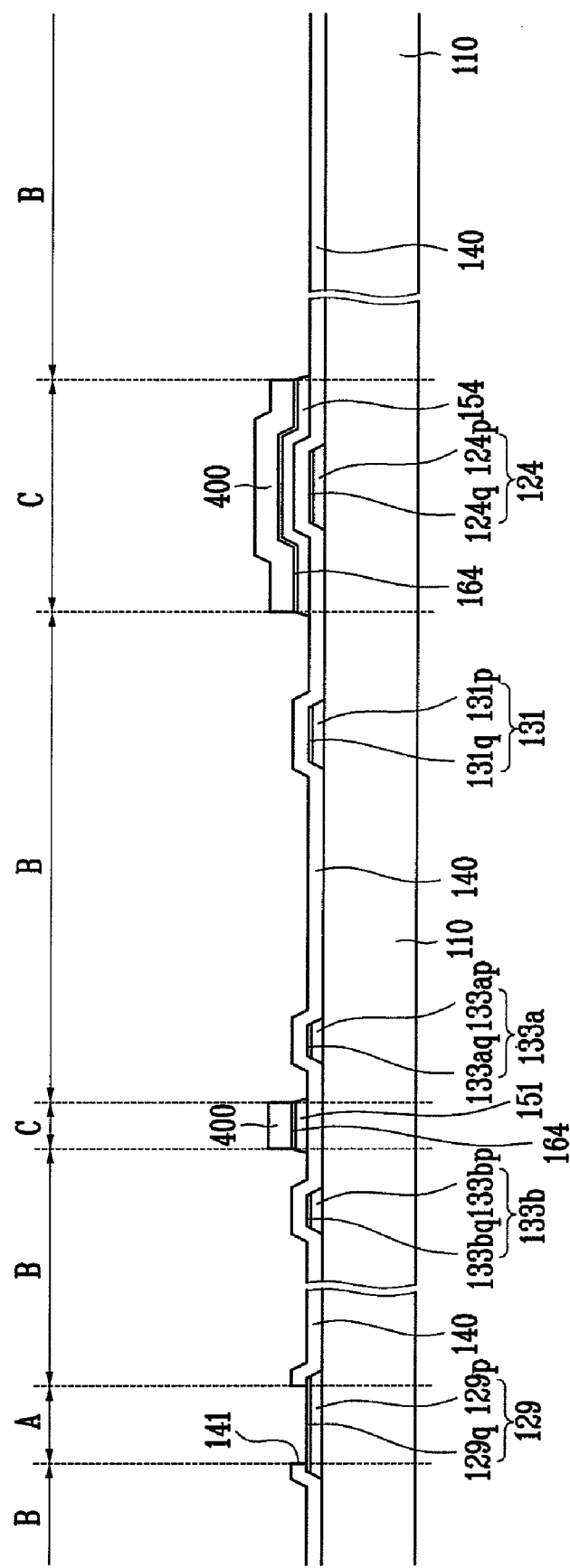

THIN FILM TRANSISTOR PANEL AND MANUFACTURING METHOD THEREOF

CROSS-REFERENCE TO RELATED APPLICATION

This application claims priority to Korean Patent Application No. 10-2006-0097401, filed on Oct. 2, 2006, the disclosure of which is incorporated by reference herein in its entirety.

BACKGROUND OF THE INVENTION (a) Technical Field

The present disclosure relates to a thin film transistor array panel for a liquid crystal display and a manufacturing method thereof.

(b) Discussion of the Related Art

A liquid crystal display (LCD) includes a pair of display panels having field generating electrodes and polarizers, and a liquid crystal layer interposed between the two display panels. A field generating electrode generates an electric field on the liquid crystal layer. The arrangement of liquid crystal molecules in the liquid crystal layer varies as the intensity of the electric field changes, thereby changing the polarization of light passing through the liquid crystal layer. A polarizer blocks or transmits the polarized light appropriately to make bright and dark regions, thereby displaying desired images.

One of the display panels includes a plurality of pixels having switching elements and a plurality of display signal lines, and a gate driver having a plurality of stages transmitting gate signals to gate lines of the display signal lines to turn on/off the switching elements of the pixels.

Each stage of the gate driver is connected to one of the signal lines, and the stage receives a gate on/off voltage and a clock signal, and transmits the inputted gate on/off voltage and clock signal to the signal line connected thereto.

The gate driver may be integrated with the substrate, and then the gate lines may extend to connect to the gate driver directly. Here, for connecting gate wires of the gate driver and data wires of the gate driver, contact holes exposing the gate wires are formed. The data wires are connected to the gate wires through the contact holes using a connecting member which may be made of Indium Tin Oxide (ITO).

Alternately, if the gate driver is formed outside of the substrate, pad portions, which connect the gate on/off signal lines to the stages of the gate driver, are required for transmitting the gate on/off voltage to the stages of the gate driver. Here, for connecting the pad portions to the signal lines, contact holes exposing the signal lines are formed, and then the signal lines are contacted to the stages of the gate driver through the contact holes using a connecting member which may be made of ITO.

As the lengths of the signal lines increase along with the LCD size, the resistance of the lines increase, causing a signal delay or a voltage drop. In response to the increased resistance, wiring is made from of a material having a low resistivity, such as aluminum (Al). When Al is used in wiring, signal lines may have a multi-layered structure including an Al layer and another layer. However, if the signal lines including Al contact with the ITO used in pixel electrodes or connecting members of an LCD directly, then the Al may become oxidized or corroded.

The thin film transistor array panel of a liquid crystal display includes a plurality of thin layers such as a gate layer, a data layer, and a semiconductor layer. The thin layers are respectively patterned by photolithography processes using separate photo-masks. However, when adding one additional mask, various steps such as exposing, developing, and cleansing are repeated, and thereby manufacturing time and cost significantly increase.

Accordingly, there is a need for a thin film transistor array panel with improved resistance to oxidation or corrosion and a method of manufacturing the same which can reduce the time and expense of manufacturing.

SUMMARY OF THE INVENTION

A thin film transistor array panel according to an embodiment of the present invention includes a substrate, a gate line and a gate-layer signal transmitting line of a gate driving circuit portion formed on the substrate, a gate insulating layer formed on the gate line and the gate-layer signal transmitting line and having a first contact hole exposing a portion of the gate-layer signal transmitting line, a semiconductor layer formed on the gate insulating layer, a data line including a source electrode, and a drain electrode formed on the gate insulating layer and the semiconductor layer, a data-layer signal transmitting line of the gate driving circuit portion formed on the gate insulating layer and connected to the gate-layer signal transmitting line through the first contact hole, a pixel electrode connected to the drain electrode, and a passivation layer formed on the data line, the drain electrode, and the data-layer signal transmitting line of the driving circuit portion. The data line, the drain electrode, and the data-layer signal transmitting line have a triple-layered structure including a lower layer, an intermediate layer, and an upper layer, and the lower layer is made of a same layer as the pixel electrode.

The data-layer signal transmitting line may include a source electrode of a driving thin film transistor of the gate driving circuit portion.

The lower layer and the upper layer may include amorphous indium tin oxide, indium tin oxide, or indium zinc oxide, and the intermediate layer may include chromium, molybdenum, tantalum, or titanium.

The gate line and the gate-layer signal transmitting line may include a lower layer including chromium, a chromium-nitrogen alloy, or molybdenum, and an upper layer including aluminum or an aluminum alloy.

A thin film transistor array panel according to exemplary embodiment of the present invention includes a substrate, a gate line formed on the substrate and including a gate pad for contact with an external driving circuit, a gate insulating layer formed on the gate line having a first contact hole exposing a portion of the gate pad, a semiconductor layer formed on the gate insulating layer, a data line including a source electrode, and a drain electrode formed on the gate insulating layer and the semiconductor layer, a conductor formed on the gate insulating layer and connected to the gate pad through the first contact hole, a pixel electrode connected to the drain electrode, and a passivation layer formed on the data line, the drain electrode, and the conductor and having a second contact hole exposing the conductor. The data line, the drain electrode, and the conductor have a triple-layered structure including a lower layer, an intermediate layer, and an upper layer, and the lower layer is made of a same layer as the pixel electrode.

The lower layer and the upper layer may include amorphous indium tin oxide, indium tin oxide, or indium zinc oxide, and the intermediate layer may include chromium, molybdenum, tantalum, or titanium.

The gate line may include a lower layer including chromium, a chromium-nitrogen alloy, or molybdenum, and an upper layer including aluminum or an aluminum alloy.

A method of manufacturing a thin film transistor array panel according to an exemplary embodiment of the present invention includes forming a first signal line on a substrate, forming a gate insulating layer having a first contact hole on the first signal line and a semiconductor layer including an impurity semiconductor and an intrinsic semiconductor, forming a second signal line and a drain electrode on the impurity semiconductor, a conductor connected to the first signal line through the first contact hole, and a pixel electrode, and forming a passivation layer on the data line, the drain electrode, and the conductor and having a second contact hole exposing a portion of the drain electrode.

The forming of the gate insulating layer and the semiconductor may include depositing a gate insulating layer on the first signal line, depositing an intrinsic amorphous silicon (a-Si) layer on the gate insulating layer, depositing an extrinsic a-Si layer on the amorphous silicon layer, forming a photoresist film on the extrinsic a-Si layer and exposing a first portion of the extrinsic a-Si layer, and forming an impurity semiconductor and an intrinsic semiconductor and a first contact hole exposing a portion of the first signal line, by patterning the extrinsic a-Si layer, the intrinsic a-Si layer, and the gate insulating layer using the photoresist film as mask.

The forming of the impurity semiconductor, the intrinsic semiconductor, and the first contact hole may include etching the first portion of the extrinsic a-Si layer, the underlying intrinsic a-Si layer, and the underlying gate insulating layer using the photoresist film as a mask, reducing a thickness of the photoresist film to expose a second portion of the extrinsic a-Si layer; removing the second portion of the extrinsic a-Si layer, the underlying intrinsic a-Si layer, and the underlying gate insulating layer, and removing the portions of the photoresist film that remain.

The forming of the photoresist film may include coating a photoresist, and exposing the photoresist to light through a mask having light transmitting transparent areas, translucent areas, and light blocking opaque areas. The light transmitting transparent areas may correspond to the first portion of the extrinsic a-Si layer, and the translucent areas may correspond to the second portion of the extrinsic a-Si layer.

The forming of the second signal line, the drain electrode, the conductor, and the pixel electrode may include depositing a metal layer having a triple-layered structure including a lower layer, an intermediate layer, and an upper layer on the substrate, forming a photoresist film on a first portion of the metal layer where the second signal line, the drain electrode, the conductor, and the pixel electrode are formed, on the metal layer; removing the upper layer, the intermediate layer, and the lower layer of the metal layer by etching using the photoresist film as a mask, reducing a thickness of the photoresist film in a second portion of the metal layer where the second signal line, the drain electrode, and the conductor are formed, forming a pixel electrode by etching the upper layer and the intermediate layer of the metal layer using the photoresist film as a mask, and removing the portions of the photoresist film that remain to expose the second signal line, the drain electrode, and the conductor.

The lower layer and the upper layer may include amorphous indium tin oxide, indium tin oxide, or indium zinc oxide, and the intermediate layer may include chromium, molybdenum, tantalum, or titanium.

The first signal line may include a lower layer including chromium, a chromium-nitrogen alloy, or molybdenum, and an upper layer including aluminum or an aluminum alloy.

The conductor may include a data-layer signal transmitting line of a gate driving circuit portion, and the data-layer signal transmitting line may include a source electrode of a driving thin film transistor of the gate driving circuit portion.

The first signal line may include a gate line. The first signal line may include a gate-layer signal transmitting line of the gate driving circuit portion.

BRIEF DESCRIPTION OF THE DRAWINGS

The present invention will become more apparent by describing in detail exemplary embodiments thereof with reference to the attached drawings, in which:

FIG. 7A to FIG. 7F are sectional views of the TFT array panel shown in FIG. 5 and FIG. 6 in steps of a manufacturing method thereof according to an exemplary embodiment of the present invention;

DETAILED DESCRIPTION OF THE EMBODIMENTS

Figure 1:
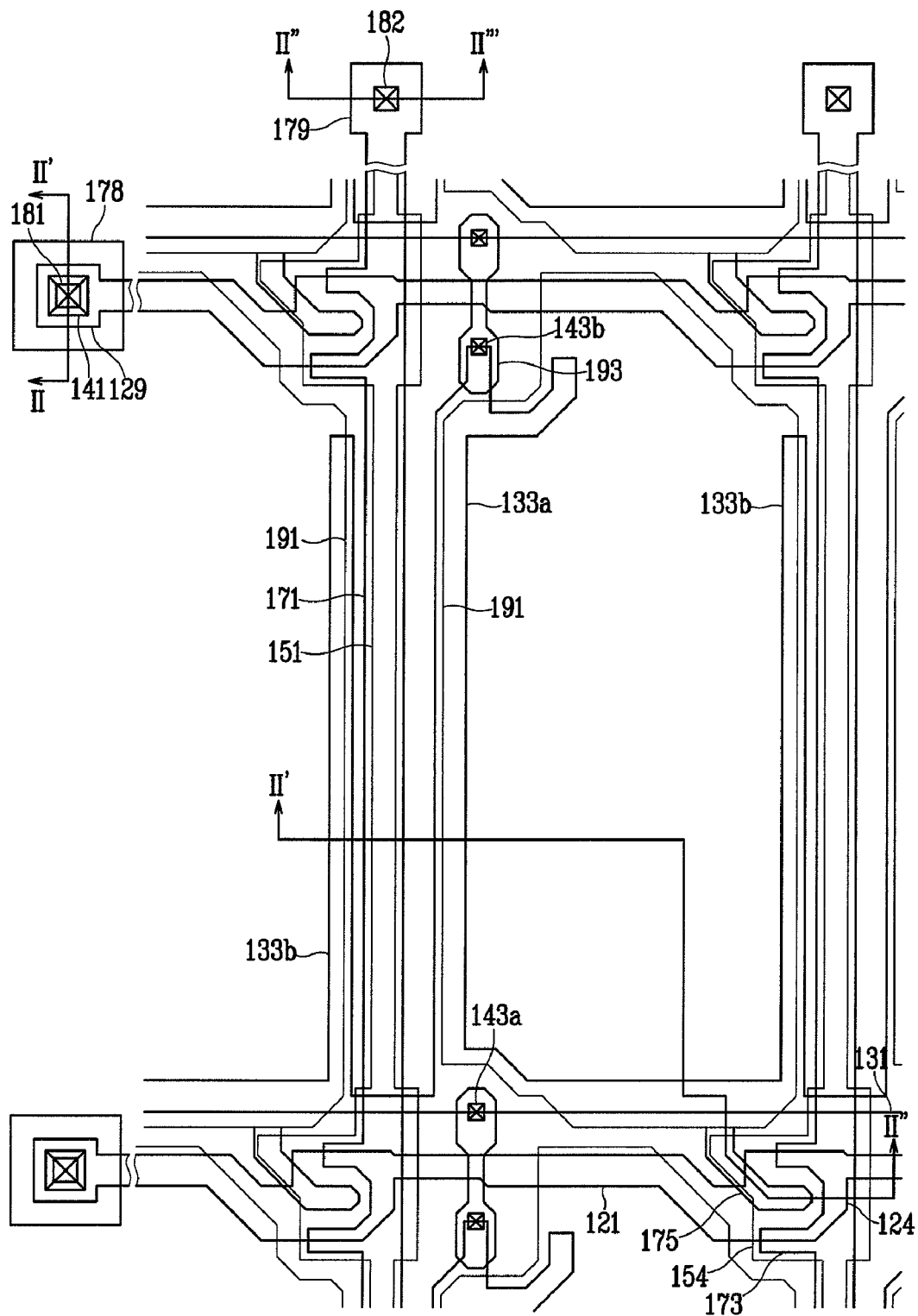
FIG. 1 is a layout view of a TFT array panel according to an exemplary embodiment of the present invention.

Hereinafter, exemplary embodiments of the present invention will be described in detail with reference to the accompanying drawings. This invention may, however, be embodied in many different forms and should not be construed as limited to the embodiments set forth herein.

Like reference numerals may designate like elements throughout the specification. It will be understood that when an element such as a layer, film, region, or substrate is referred to as being "on" another element, it can be directly on the other element or intervening elements may also be present. A thin film transistor (TFT) array panel according to an exemplary embodiment of the present invention will be described in detail with reference to FIG. 1 and FIG. 2.

Figure 2:
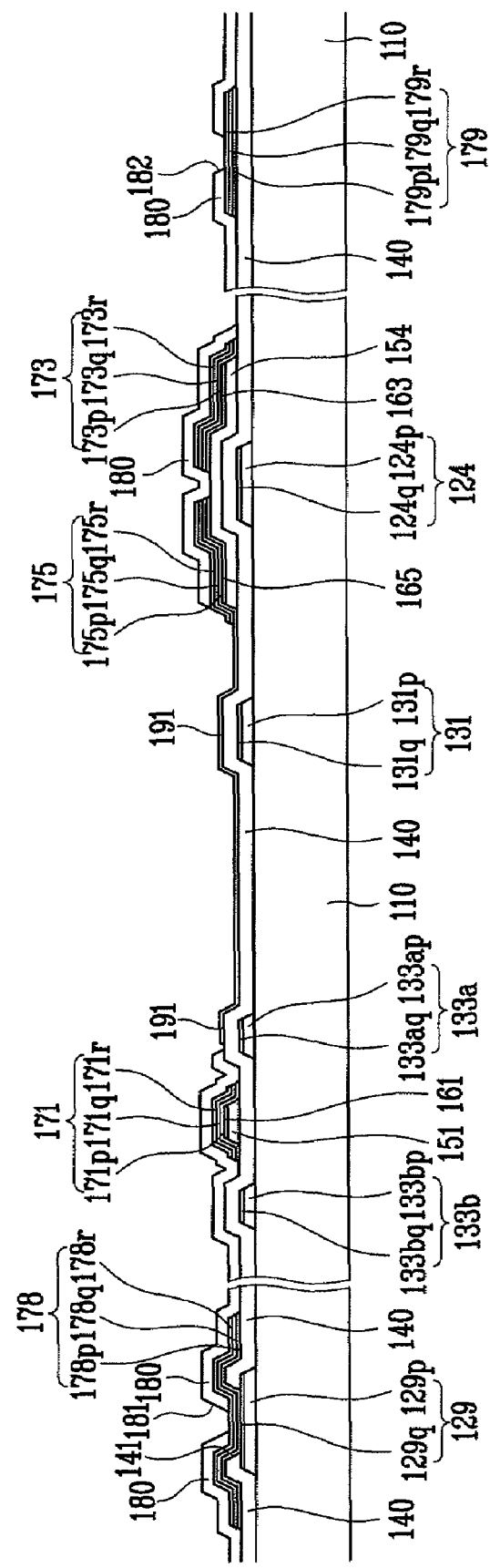
FIG. 2 is a sectional view of the TFT array panel shown in FIG. 1 taken along line II-II'-II''-II'''.

FIG. 1 is a layout view of a TFT array panel according to an exemplary embodiment of the present invention, and FIG. 2 is a sectional view of the TFT array panel shown in FIG. 1 taken along line II-II'-II"-II'".

A plurality of gate lines 121 and a plurality of storage electrode lines 131 are formed on an insulating substrate 110 and may be made of a material such as, for example, transparent glass or plastic.

The gate lines 121 transmit gate signals and extend substantially in a transverse direction. Each of the gate lines 121 includes a plurality of gate electrodes 124 projecting downward and a gate pad 129 having a large area for contact with another layer or an external driving circuit. A gate driving circuit (not shown) for generating the gate signals may be mounted on a flexible printed circuit (FPC) film (not shown). The FPC film may be attached to the substrate 110, directly mounted on the substrate 110, or integrated onto the substrate 110. The gate lines 121 may extend to connect to a driving circuit that may be integrated on the substrate 110.

The storage electrode lines 131 are supplied with a predetermined voltage, and each of the storage electrode lines 131 includes a stem extending substantially parallel to the gate lines 121 and a plurality of pairs of first and second storage electrodes 133a and 133b branching from the stem. Each of the storage electrode lines 131 is disposed between two adjacent gate lines 121, and the stem is close to one of the two adjacent gate lines 121. Each of the storage electrodes 133a and 133b has a fixed end portion connected to the stem and a free end portion disposed opposite thereto. The fixed end portion of the first storage electrode 133a has a large area, and the free end portion thereof is bifurcated into a linear branch and a curved branch. However, the storage electrode lines 131 may have various shapes and arrangements.

The gate lines 121 and storage electrode lines 131 include two conductive films, i.e., a lower film and an upper film disposed thereon, which have different physical characteristics. The upper layer may be made of low resistivity metal such as, for example, Al and an Al alloy such as, for example, AlNd for reducing signal delay or voltage drop. The lower layer may be made of material such as, for example, Cr, Mo, Ta, Ti, or alloys thereof which have good physical, chemical, and electrical contact characteristics with other materials such as indium tin oxide (ITO) or indium zinc oxide (IZO). One example of a suitable Cr alloy may be a chromium-nitrogen alloy.

The gate lines 121 and the storage electrode lines 131 may also have a single-layered structure including an Al-containing metal.

In FIG. 2, for the gate electrodes 124, the storage electrode lines 131, and the storage electrodes 133a and 133b, the lower and upper films thereof are denoted by additional characters p and q, respectively.

The lateral sides of the gate lines 121 and the storage electrode lines 131 are inclined relative to a surface of the substrate 110, and the inclination angle thereof may be in a range of about 30 to about 80 degrees.

A gate insulating layer 140 may be made of, for example, silicon nitride (SiNx) or silicon oxide (SiOx), and is formed on the gate lines 121 and the storage electrode lines 131. The gate insulating layer 140 has a plurality of contact holes 141 exposing portions of the gate pads 129, a plurality of contact holes 143a exposing portions of the storage electrode lines 131 near the fixed end portions of the first storage electrodes 133a, and a plurality of contact holes 143b exposing the linear branches of the free end portions of the first storage electrodes 133a, respectively.

A plurality of semiconductor stripes 151 may be made of, for example, hydrogenated amorphous silicon (abbreviated to "a-Si") or polysilicon and are formed on the gate insulating layer 140. Each of the semiconductor stripes 151 extends substantially in a longitudinal direction and includes a plurality of projections 154 branching out toward the gate electrodes 124. The semiconductor stripes 151 become wider near the gate lines 121 and the storage electrode lines 131 such that the semiconductor stripes 151 cover larger areas of the gate lines 121 and the storage electrode lines 131.

A plurality of ohmic contact stripes and islands 161 and 165 are formed on the semiconductor stripes 151. The ohmic contacts 163 and 165 may be made of, for example, n+ hydrogenated a-Si heavily doped with an n-type impurity such as phosphorous, or silicide. Each of the ohmic contact stripes 161 includes a plurality of projections 163. The projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110, and the inclination angles thereof may be in a range of about 30 to about 80 degrees.

A plurality of data lines 171, a plurality of drain electrodes 175, a plurality of interconnection members 178, a plurality of pixel electrodes 191 physically and electrically connected to the drain electrodes 175, and a plurality of overpasses 193 are formed on the ohmic contacts 161 and 165, and the gate insulating layer 140.

The data lines 171 transmit data signals and extend substantially in a longitudinal direction to intersect the gate lines 121. Each of the data lines 171 also intersects the storage electrode lines 131 and runs between adjacent pairs of storage electrodes 133a and 133b. Each data line 171 includes a plurality of source electrodes 173 projecting toward the gate electrodes 124 and curved like a character J and an end portion having a data pad 179 for contact with another layer or an external driving circuit. A data driving circuit (not shown) for generating the data signals may be mounted on an FPC film (not shown), which may be attached to the substrate 110, directly mounted on the substrate 110, or integrated onto the substrate 110. The data lines 171 may extend to connect to a driving circuit that may be integrated on the substrate 110.

The drain electrodes 175 are separated from the data lines 171 and disposed opposite the source electrodes 173 with respect to the gate electrodes 124. Each of the drain electrodes 175 includes a wide end portion and a narrow end portion. The narrow end portion is partly enclosed by a source electrode 173.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The interconnection member 178 covers the gate pad 129 exposed through the contact hole 141 of the gate insulating layer 140 to contact the gate pad 129.

The data lines 171, the drain electrodes 175, and the interconnection members 178 have a triple-layered structure including lower layers 171p, 175p, and 178p, intermediate layers 171q, 175q, and 178q, and upper layers 171r, 175r, and 178r. The lower layers 171p, 175p, and 178p may be made of a transparent conductive material such as, for example, amorphous indium tin oxide (a-ITO), indium tin oxide (ITO), and indium zinc oxide (IZO), the intermediate layers 171q, 175q, and 178q may be made of a refractory metal such as, for example, chromium (Cr), molybdenum (Mo), tantalum (Ta), and titanium (Ti) or alloys thereof, and the upper layers 171r, 175r, and 178r may be made of a transparent conductive material such as, for example, a-ITO, ITO, and IZO like the lower layers 171p, 175p, and 178p. However, the data lines 171, the drain electrodes 175, and the interconnection members 178 may be made of various metals or conductors.

The data lines 171, the drain electrodes 175, and the interconnection members 178 have inclined edge profiles, and the inclination angles thereof may be in a range of about 30 to about 80 degrees.

The ohmic contacts 161 and 165 are interposed between the underlying semiconductor stripes 151 and the overlying conductors 171 and 175 thereon, and reduce the contact resistance therebetween. Although the semiconductor stripes 151 are narrower than the data lines 171 at most places, the width of the semiconductor stripes 151 becomes larger near the gate lines 121 and the storage electrode lines 131 as described above, to smooth the profile of the surface, thereby preventing disconnection of the data lines 171. The semiconductor stripes 151 include some exposed portions, which are not covered with the data lines 171 and the drain electrodes 175, such as portions located between the source electrodes 173 and the drain electrodes 175.

The pixel electrodes 191 are directly connected to the lower layers 175p of the drain electrodes 175, and are made of a transparent conductive material, such as, for example a-ITO, ITO, and IZO, like the lower layers 175p of the drain electrodes 175.

The overpasses 193 cross over the gate lines 121 and are connected to the exposed portions of the storage electrode lines 131 and the exposed linear branches of the free end portions of the storage electrodes 133b through the contact holes 143a and 143b, respectively, which are disposed opposite each other with respect to the gate lines 121. The storage electrode lines 131 including the storage electrodes 133a and 133b along with the overpasses 193 can be used for repairing defects in the gate lines 121, the data lines 171, or the TFTs. The overpasses 193 may be made of the same material as the pixel electrodes 191 and may be formed simultaneously with the pixel electrodes 191.

A passivation layer 180 is formed on the data lines 171, the drain electrodes 175, the interconnection members 178, and the exposed portions of the semiconductor stripes 151. The passivation layer 180 may be made of an inorganic insulator or an organic insulator, and it may have a flat top surface. Examples of the inorganic insulator include, for example, silicon nitride and silicon oxide. The organic insulator may have photosensitivity and a dielectric constant of less than about 4.0. The passivation layer 180 may include a lower film of an inorganic insulator and an upper film of an organic insulator, such that it takes the insulating characteristics of the organic insulator while preventing the exposed portions of the semiconductor stripes 151 from being damaged by the organic insulator, and the upper layer made of an organic insulator may have a flat surface to induce the passivation layer to have a flat top surface.

The passivation layer 180 has a plurality of contact holes 181 and 182 exposing the interconnection members 178 and the data pads 179, respectively. The passivation layer 180 is removed from the pixel electrodes 191 and the overpasses 193.

The pixel electrodes 191 are physically and electrically connected to lower layers 175p of the drain electrodes 175 directly such that the pixel electrodes 191 receive data voltages from the drain electrodes 175. The pixel electrodes 191 supplied with the data voltages generate electric fields in cooperation with a common electrode (not shown) of an opposing display panel (not shown) supplied with a common voltage, which determine the orientations of liquid crystal molecules (not shown) of a liquid crystal layer (not shown) disposed between the two electrodes. A pixel electrode 191 and the common electrode form a capacitor referred to as a "liquid crystal capacitor," which stores applied voltages after the TFT is turned off.

A pixel electrode 191 overlaps a storage electrode line 131 including storage electrodes 133a and 133b. The pixel electrode 191 and the storage electrode line 131 form an additional capacitor referred to as a "storage capacitor," which enhances the voltage storing capacity of the liquid crystal capacitor.

The upper layers 178r of the interconnection members 178 and the upper layers 179r of the data pads 179 are made of a transparent conductive material such as, for example, a-ITO, ITO, and IZO having a good contact characteristic such that the adhesion between the interconnection members 178 and the data pads 179, and external devices, may be enhanced.

The interconnection members 178 include intermediate layers 178q made of a refractory metal, contact the exposed portions of the gate pads 129 directly without additional connecting members, and completely cover the exposed portions of the gate pads 129 such that the interconnection members 178 prevent the underlying gate pads 129 from contacting the additional connecting members. For example, when the additional connecting members are made of a transparent conductor such as ITO and the underlying gate pads 129 are made of an Al containing metal, the interconnection members 178 may prevent corrosion of Al due to contact with ITO.

A manufacturing method of the TFT array panel shown in FIG. 1 and FIG. 2 according to an exemplary embodiment of the present invention will be described in detail with reference to FIG. 3 to FIG. 10E along with FIG. 1 and FIG. 2.

Figure 3:
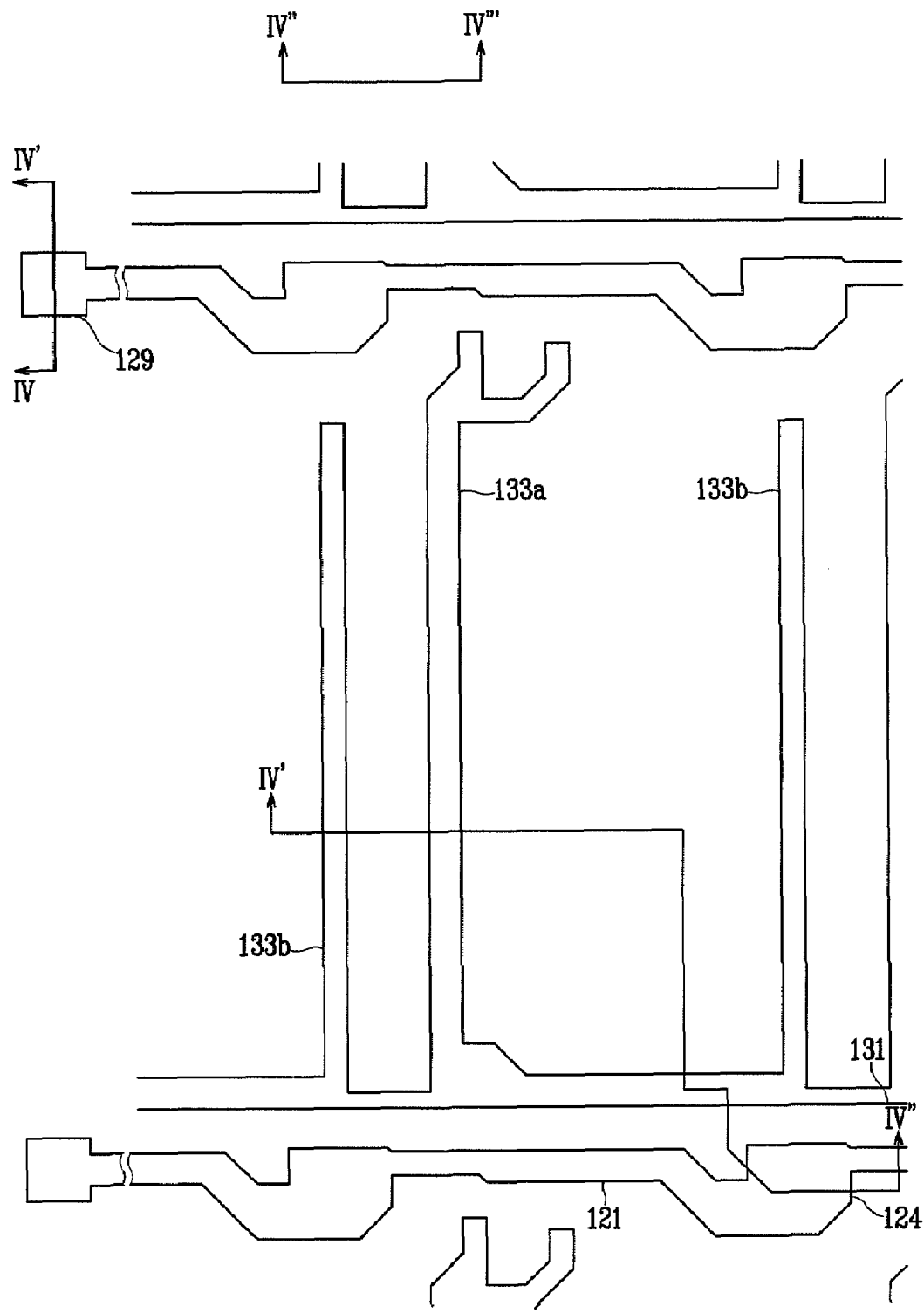
FIG. 3, FIG. 5, and FIG. 8 are layout views of the TFT array panel shown in FIG. 1 and FIG. 2 in steps of a manufacturing method thereof according to an exemplary embodiment of the present invention.
Figure 4:
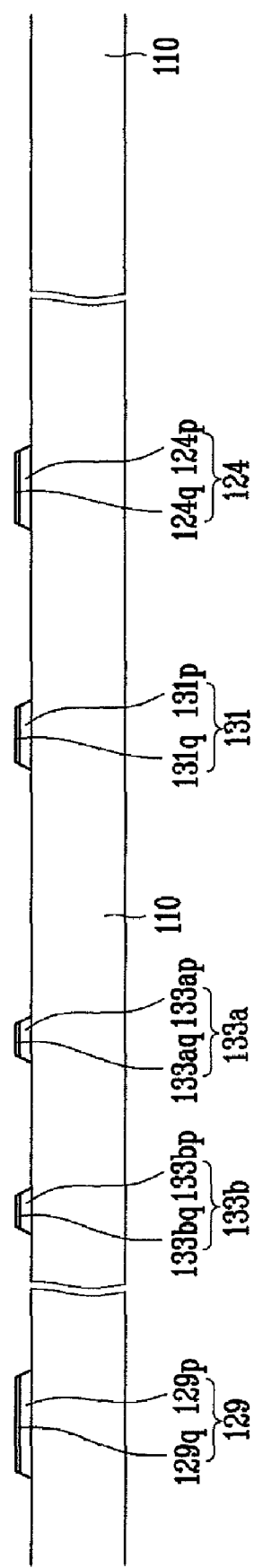
FIG. 4 is a sectional view of the TFT array panel shown in FIG. 3 taken along line IV-IV'-IV''-IV'''.
Figure 5:
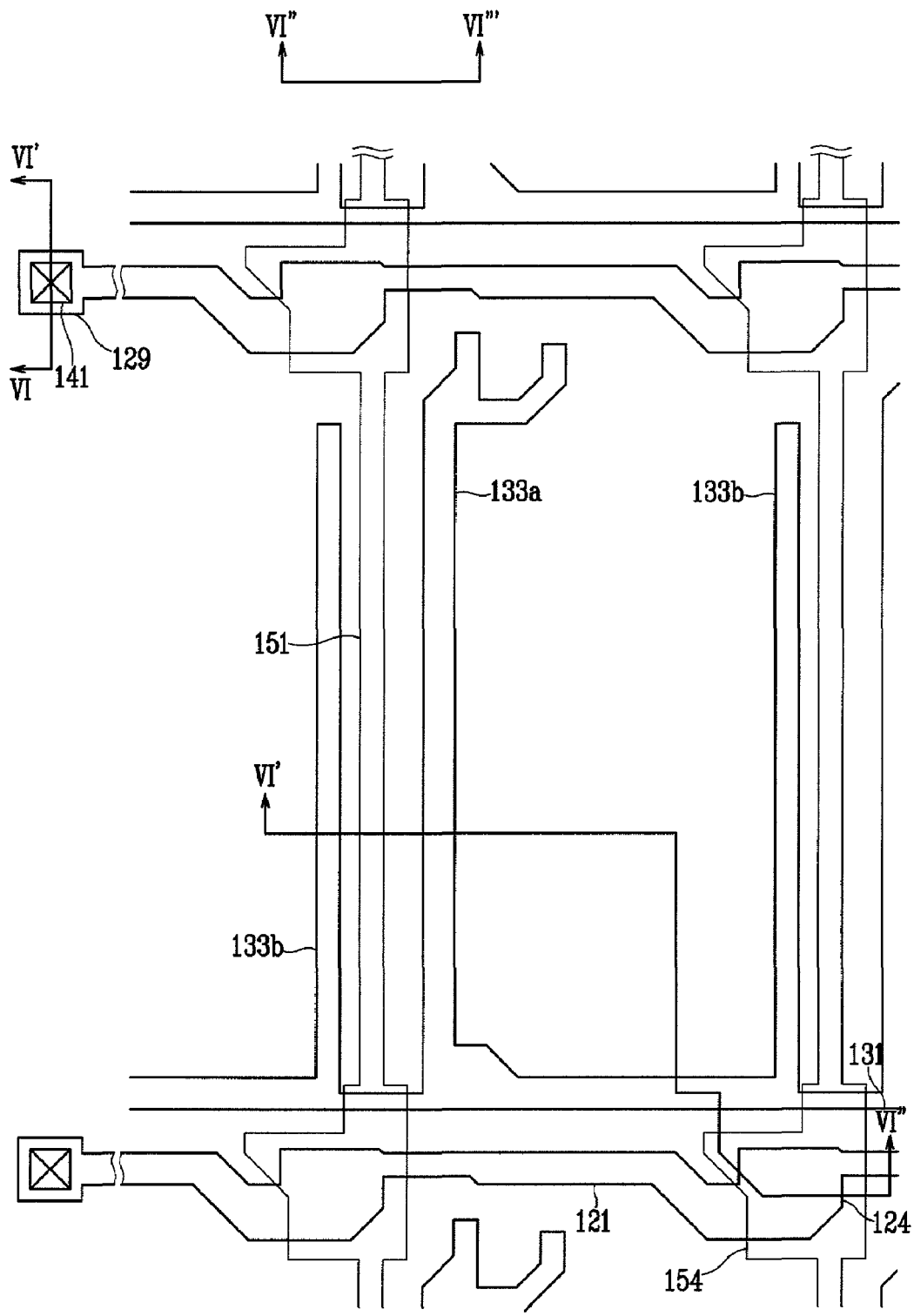
Figure 6:
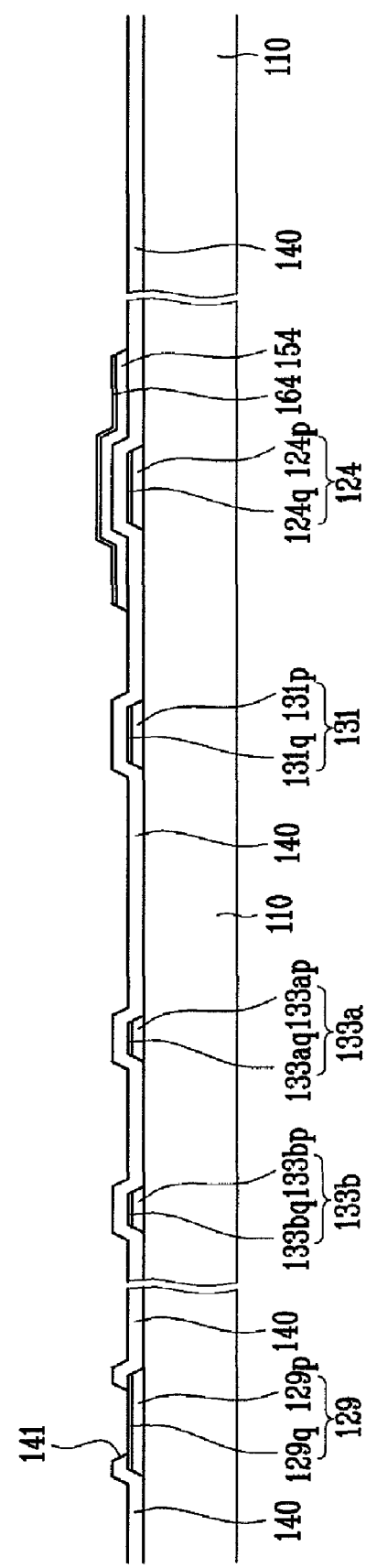
FIG. 6 is a sectional view of the TFT array panel shown in FIG. 5 taken along line VI-VI'-VI''-VI'''.
Figure 7A:
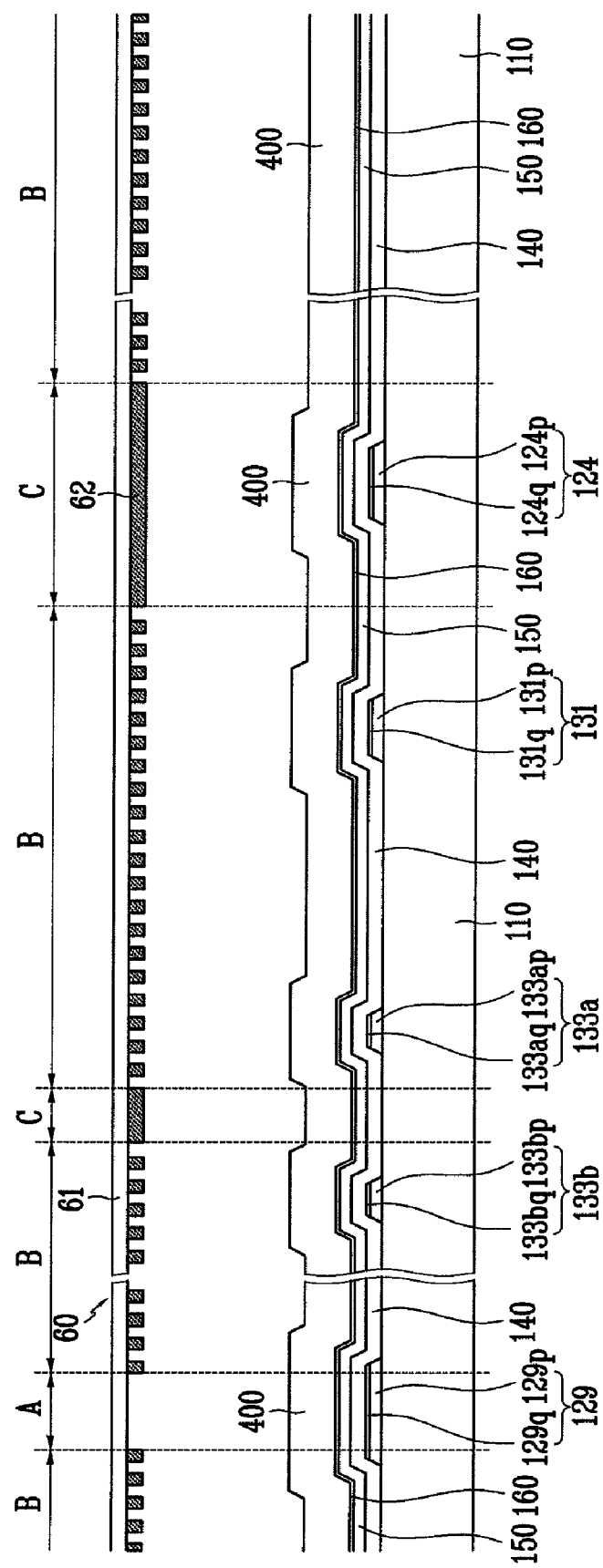
Figure 7F:
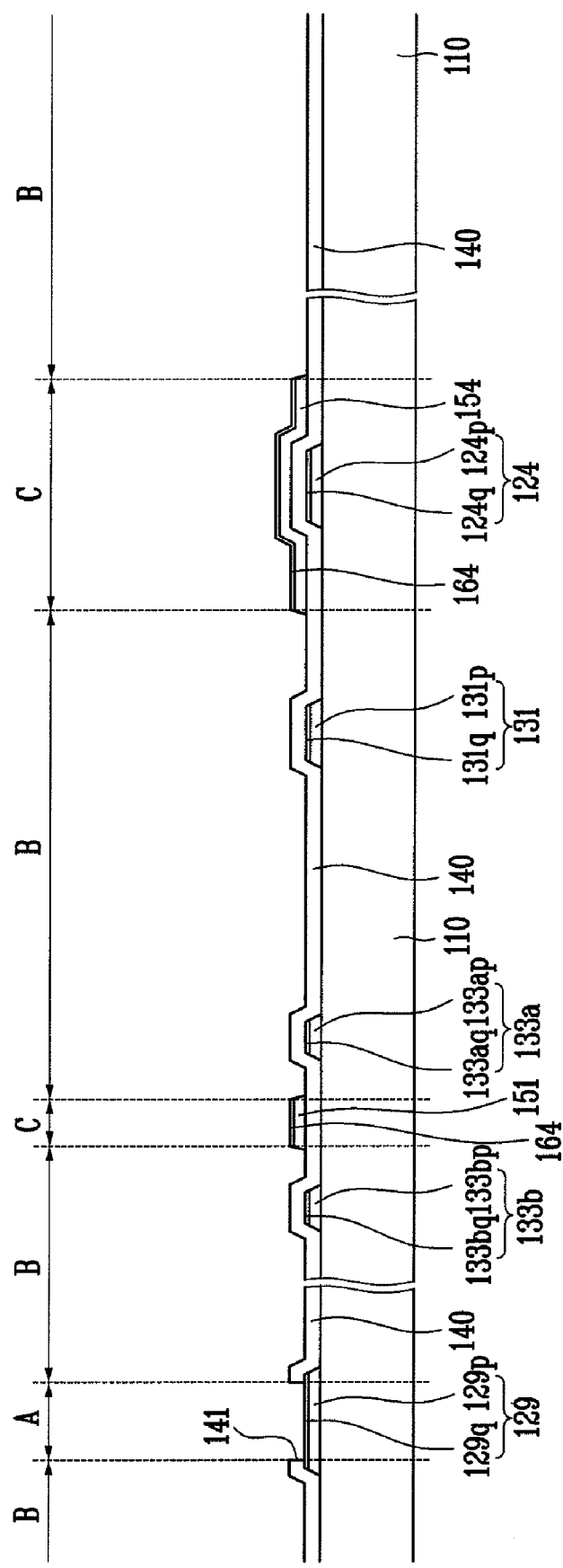
Figure 8:
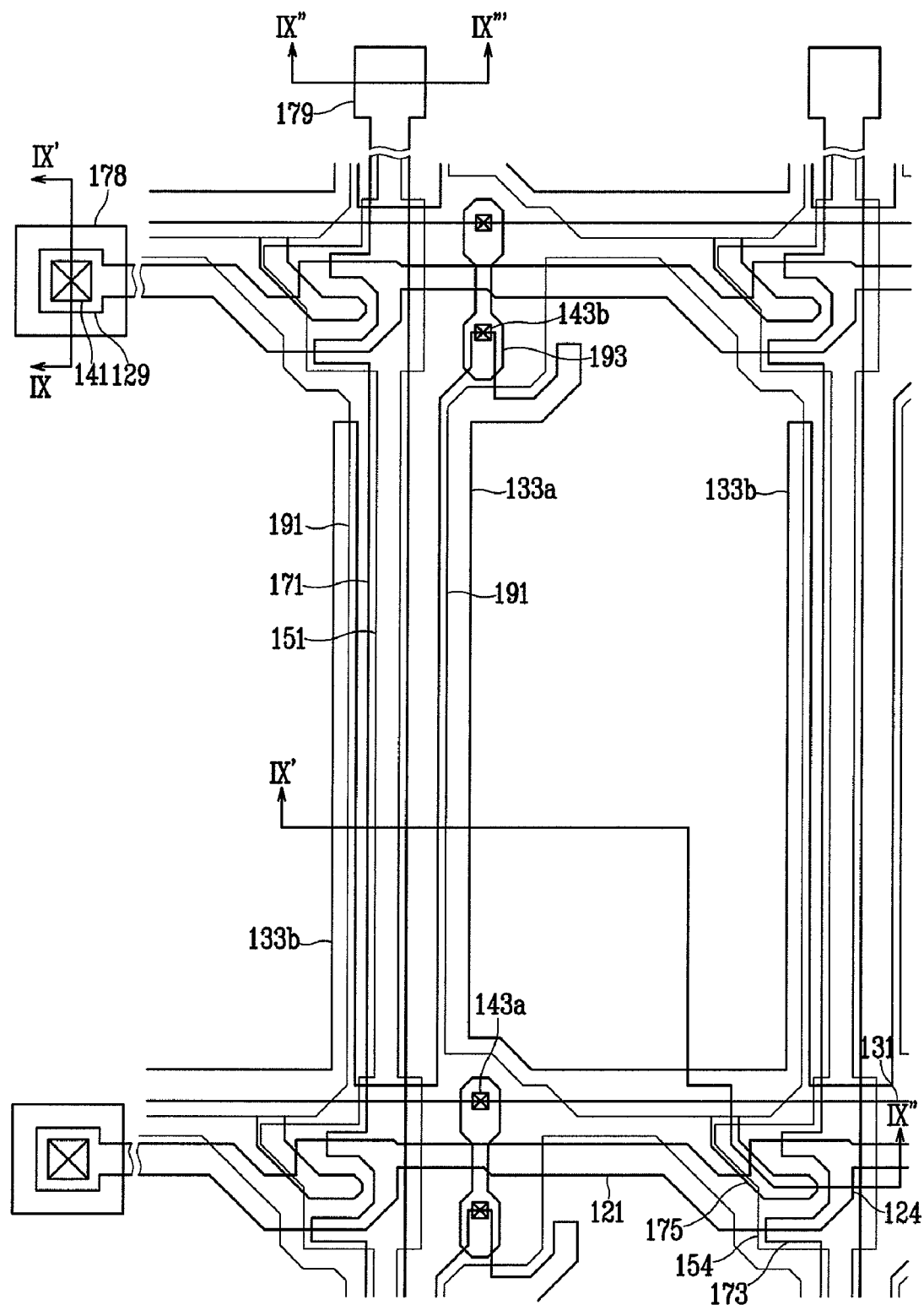
Figure 9:
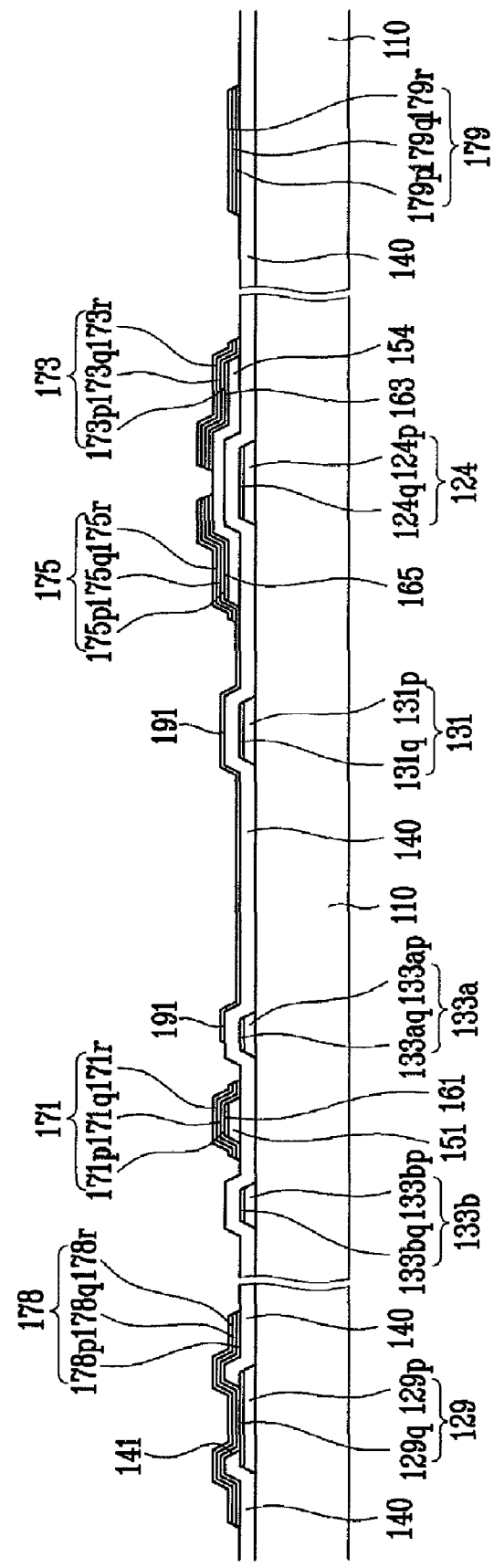
FIG. 9 is a sectional view of the TFT array panel shown in FIG. 8 taken along line IX-IX'-IX''-IX'''.

FIG. 3, FIG. 5, and FIG. 8 are layout views of the TFT array panel shown in FIG. 1 and FIG. 2 in intermediate steps of a manufacturing method thereof according to an exemplary embodiment of the present invention, FIG. 4 is a sectional view of the TFT array panel shown in FIG. 3 taken along line IV-IV'-IV''-IV''', FIG. 6 is a sectional view of the TFT array panel shown in FIG. 5 taken along line VI-VI'-VI''-VI''', and FIG. 9 is a sectional view of the TFT array panel shown in FIG. 8 taken along line IX-IX'-IX''-IX'''. FIG. 7A to FIG. 7F are sectional views of the TFT array panel shown in FIG. 5 and FIG. 6 in intermediate steps of a manufacturing method thereof according to an exemplary embodiment of the present invention, and FIG. 10A to FIG. 10E are sectional views of the TFT array panel shown in FIG. 8 and FIG. 9 in intermediate steps of a manufacturing method thereof according to an exemplary embodiment of the present invention.

Referring to FIG. 3 and FIG. 4, a lower conductive layer such as, for example, Cr, a Cr—N alloy, or Mo is deposited on an insulation substrate 110 and then an upper conductive layer of an Al-containing metal is deposited thereon. The upper conductive layer and the lower conductive layer are patterned by photolithography and etching to form a plurality of gate lines 121 and a plurality of storage electrode lines 131 having a dual-layered structure. Each gate line 121 includes a gate electrode 124 and a gate pad 129, and each storage electrode line 131 includes storage electrodes 133a and 133b. In FIG. 4, the lower layer and the upper layer of the gate lines 121 and the storage electrode lines 131 are denoted by additional characters p and q, respectively.

Next, a gate insulating layer 140 having a plurality of contact holes 141, a plurality of (intrinsic) semiconductor stripes 151 including projections 154, and a plurality of extrinsic semiconductor stripes 161 including projections 164 are formed on the substrate having the gate lines 121 and the storage electrode lines 131 as shown in FIG. 5 and FIG. 6.

The formation of the gate insulating layer 140, the extrinsic semiconductor stripes 161, and the (intrinsic) semiconductor stripes 151 will be described in more detail with reference to FIG. 7A to FIG. 7F.

Referring to FIG. 7A, the gate insulating layer 140, an intrinsic layer 150, and an extrinsic layer 160 are sequentially deposited on the substrate. The intrinsic layer 150 and the extrinsic layer 160 may be made of, for example, a-Si. The deposition of the gate insulating layer 140, intrinsic layer 150, and extrinsic layer may be performed using a technique such as, for example, plasma enhanced chemical vapor deposition (PECVD). A photoresist film 400 is then coated thereon.

Next, the photoresist film 400 is exposed through an exposure mask 60. An example of the exposure mask 60 is shown in the upper side of FIG. 7A.

The exposure mask 60 includes a substrate 61 and a plurality of opaque members 62 formed thereon. The exposure mask 60 and the substrate 61 are divided into light transmitting transparent areas A, translucent areas B, and light blocking opaque areas C depending on a distribution of the opaque members 62 on the exposure mask 60.

In the translucent areas B, the opaque members 62 are located with a predetermined distance therebetween, which is smaller than the resolution of a light exposer used for the photolithography, to be referred as a slit pattern. There are no opaque members 62 in the light transmitting transparent areas A, and the opaque members 62 are located throughout the light blocking opaque areas C.

The translucent areas B may have a lattice pattern, or they may be thin film(s) with an intermediate transmittance or an intermediate thickness instead of the slit pattern.

The photoresist film 400 is exposed to light through the exposure mask 60 and then the exposed photoresist film 400 is developed. As shown in FIG. 7B, the developed photoresist film 400 has a position-dependent thickness such that the photoresist film 400 located in the light transmitting transparent area A is removed, the thickness of the photoresist film 400 located in the translucent areas B is reduced, and the thickness of the photoresist film located in the light blocking opaque areas C is not reduced.

Here, a thickness ratio of the photoresist film 400 located in the light blocking opaque areas C to the photoresist film 400 located in the translucent areas B may be adjusted depending upon the process conditions in the subsequent process steps. The thickness of the photoresist film 400 located in the translucent areas B may be equal to or less than half of the thickness of the photoresist film 400 located in the light blocking opaque areas C.

The position-dependent thickness of the photoresist film may also be obtained by using a reflowable photoresist material. Once a photoresist pattern made of a reflowable material is formed by using a normal exposure mask with only transparent areas and opaque areas, it may be subjected to a reflow process to flow onto areas without the photoresist, thereby forming thin portions.

Next, the extrinsic layer 160, the intrinsic layer 150, and the gate insulating layer 140 are etched using the remaining photoresist film 400 as a mask to remove the extrinsic layer 160, the intrinsic layer 150 and the gate insulating layer 140 located in the light transmitting transparent area A such that the contact holes 141 exposing the gate pads 129 are formed in the gate insulating layer 140 as shown in FIG. 7C.

As shown in FIG. 7D, a technique such as, for example, ashing is performed on the photoresist film 400 such that the photoresist film 400 disposed in the translucent areas B is removed and the thickness of the photoresist film disposed in the light blocking opaque areas C is reduced.

Referring to FIG. 7E, the extrinsic layer 160 and the intrinsic layer 150 are etched using the remaining photoresist film 400 located in the light blocking opaque areas C as a mask to form the extrinsic semiconductor stripes 161 including projections 164 and the intrinsic semiconductor stripes 151 including projections 154.

Finally, the remaining photoresist film 400 located in the light blocking opaque areas C is removed, for example, by ashing as shown in FIG. 7F.

As described above, the gate insulating layer 140, the intrinsic layer 150, and the extrinsic layer 160 may be patterned using one exposure mask to form the contact holes 141 exposing the gate pads 129 in the gate insulating layer 140 and to form the extrinsic semiconductor stripes 161 and the intrinsic semiconductor stripes 151, at substantially the same time, such that an additional exposure mask is not required to reduce the production cost.

Referring to FIG. 8 and FIG. 9, a plurality of data lines 171 including source electrodes 173 and data pads 179, a plurality of drain electrodes 175, and a plurality of interconnection members 178 are formed, and a plurality of pixel electrodes 191 and a plurality of overpasses 193 are formed at substantially the same time.

The TFT array panel shown in FIG. 8 and FIG. 9 will be described in more detail with reference to FIG. 10A to FIG. 10E.

Figure 10A:
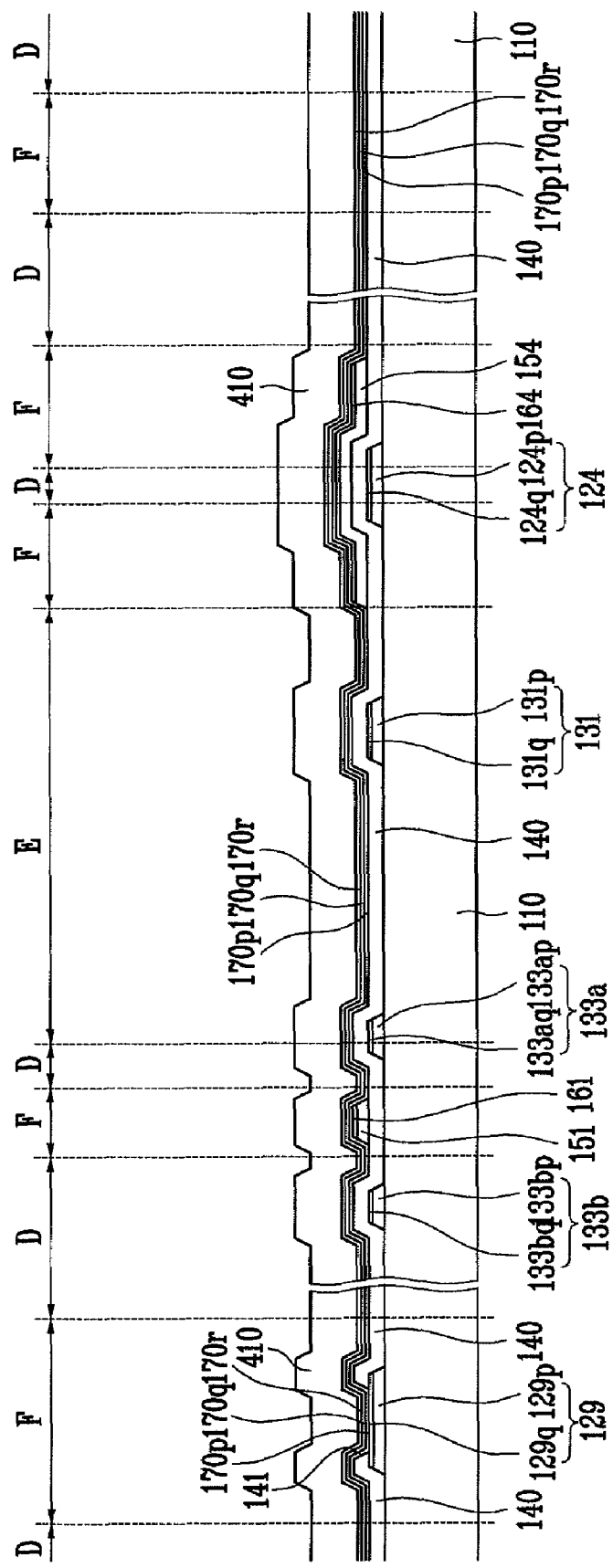
FIG. 10A to FIG. 10E are sectional views of the TFT array panel shown in FIG. 8 and FIG. 9 in steps of a manufacturing method thereof according to an exemplary embodiment of the present invention.

Referring to FIG. 10A, a lower conductive layer 170p made of a transparent conductive material such as, for example, a-ITO, ITO, and IZO, an intermediate conductive layer 170q made of a refractory metal such as, for example, Cr, Mo, Ta, and Ti, and an upper conductive layer 170r made of a transparent conductive material such as, for example, a-ITO, ITO, and IZO are sequentially deposited on the extrinsic semiconductor stripes 161 and 164 and the gate insulating layer 140, and then a photoresist film 410 is coated thereon.

Figure 10B:
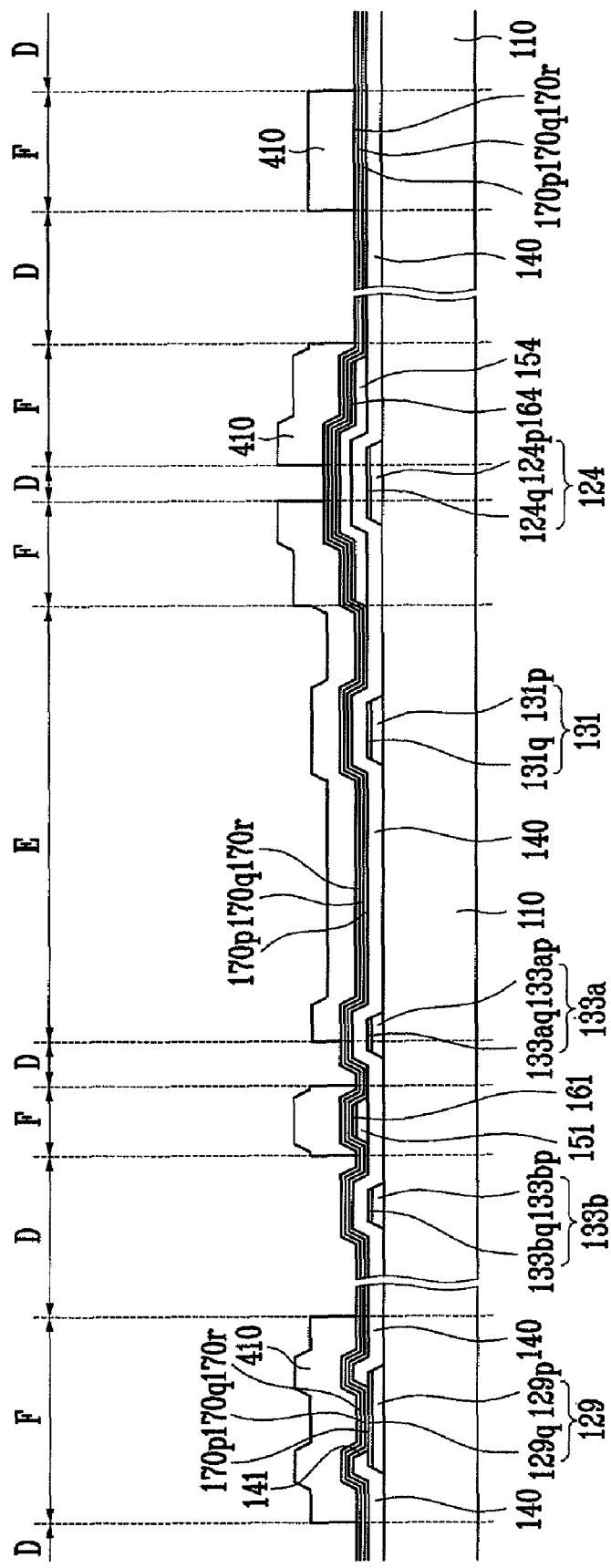

Next, the photoresist film 410 is exposed through an exposure mask having light transmitting transparent areas D, translucent areas E, and light blocking opaque areas F, and then the exposed photoresist film 410 is developed. As shown in FIG. 10B, the developed photoresist film 410 has a position-dependent thickness such that the photoresist film 410 located in the light transmitting transparent area D is removed, that the thickness of the photoresist film 410 located in the translucent areas E is reduced, and that the photoresist film 410 located in the light blocking opaque areas F is not removed.

Figure 10C:
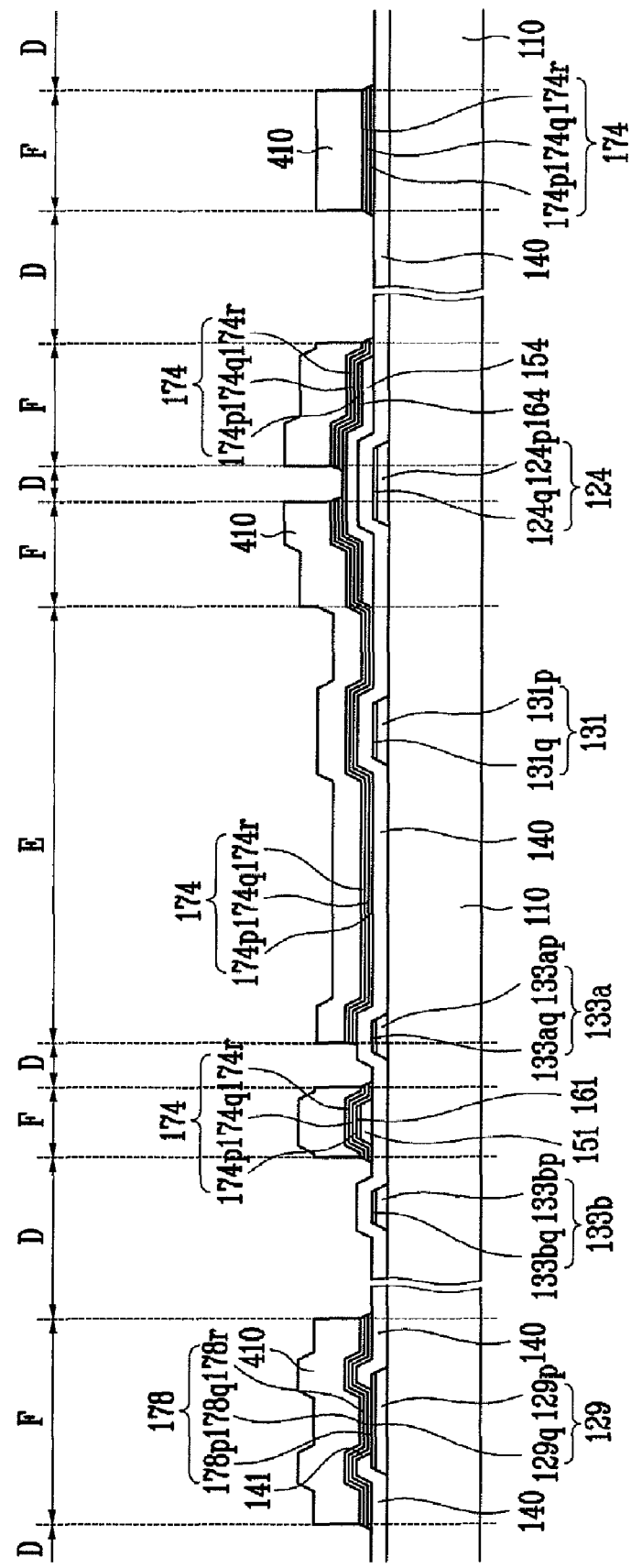

The exposed upper conductive layer 170r, the intermediate conductive layer 170q, and the lower conductive layer 170p in the light transmitting transparent areas D are sequentially etched using the photosensitive film 410 as a mask to form a plurality of data conductors 174 including a lower layer 174p, an intermediate layer 174q, and an upper layer 174r, and a plurality of interconnection member 178 including a lower layer 178p, an intermediate layer 178q, and an upper layer 178r, as shown in FIG. 10C.

Figure 10D:
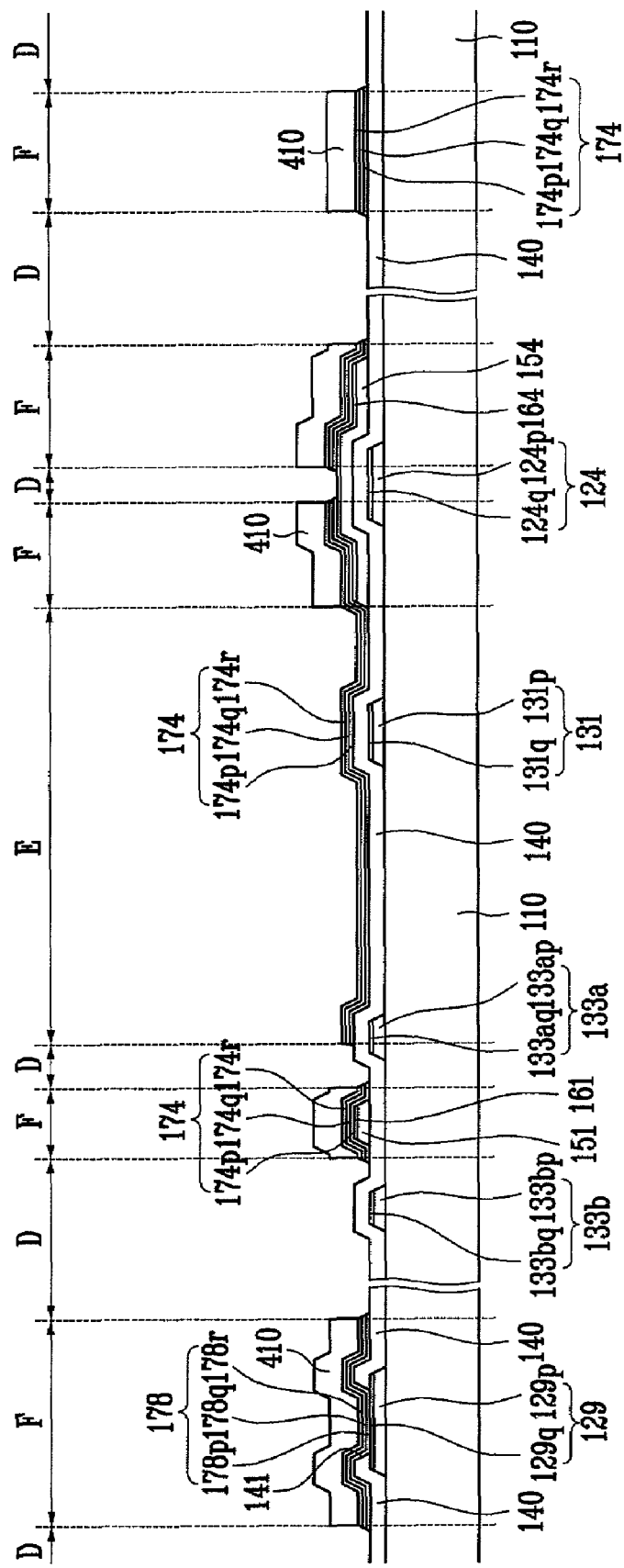

As shown in FIG. 10D, a technique such as, for example ashing may be performed on the photoresist film 410 such that the photoresist film disposed in the translucent areas E is removed and the thickness of the photoresist film disposed in the light blocking opaque areas F is reduced.

Figure 10E:
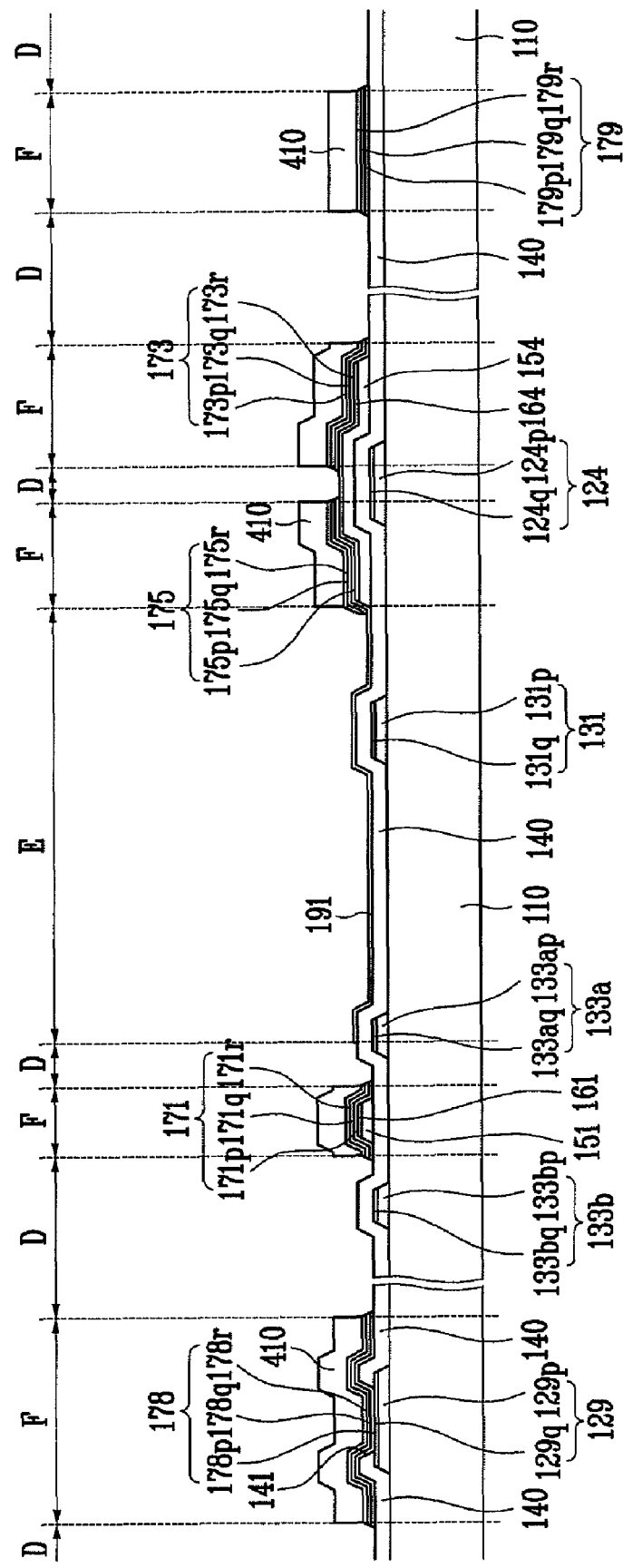

Referring to FIG. 10E, the upper layer 174r and the intermediate layer 174q of the data conductors 174 are sequentially etched using the remaining photosensitive film 410 located in the light blocking opaque areas F as a mask to form a plurality of data lines 171 including source electrodes 173, and a plurality of drain electrodes 175, and simultaneously to form a plurality of pixel electrodes 191 and a plurality of overpasses 193 made of the lower layer 174p.

Thereafter, exposed portions of the extrinsic semiconductor 164, which are not covered with the data lines 171 and the drain electrodes 175, are removed to complete a plurality of ohmic contact stripes 161 including projections 163 and a plurality of ohmic contact islands 165 and to expose portions of the intrinsic semiconductor stripes 151.

As described above, the pixel electrodes 191 and the overpasses 193 as well as the data lines 171 and the drain electrodes 175 are formed using only one exposure mask such that an additional exposure mask is not required to reduce the production cost and time.

Finally, a passivation layer 180 is deposited and patterned by photolithography (and etching) to expose the pixel electrodes 191 and the overpasses 193, and to form a plurality of contact holes 181 and 182 exposing the interconnection members 178 and the data pads 179, respectively, as shown in FIG. 1 and FIG. 2.

Figure 11:
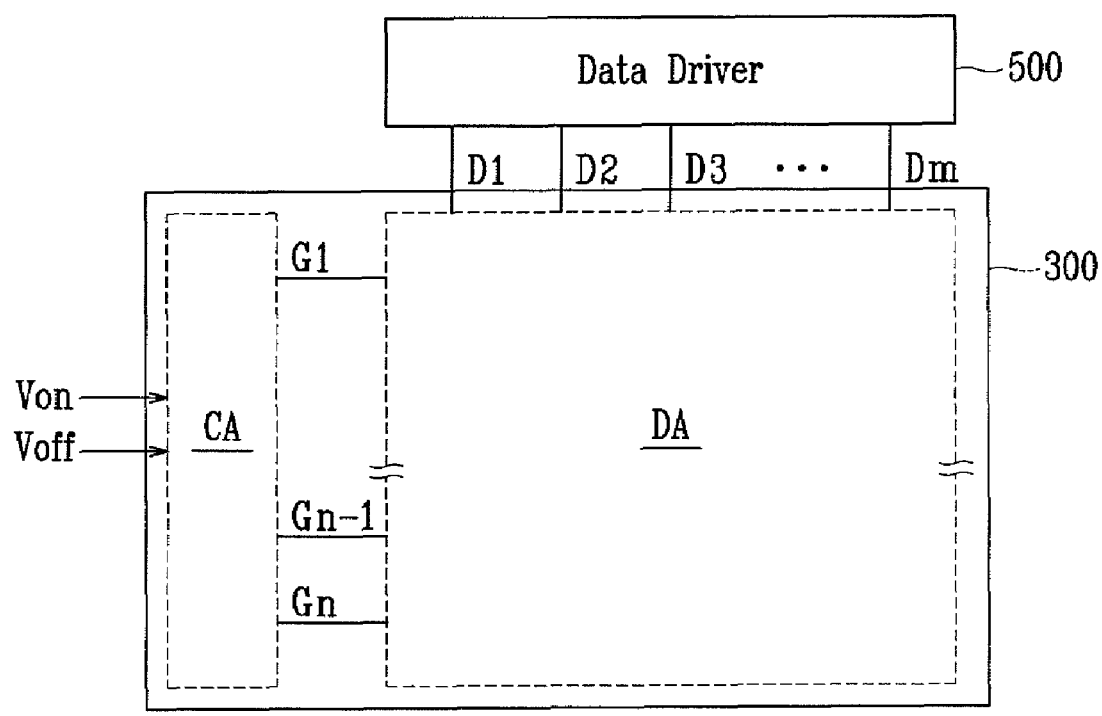
FIG. 11 is a block diagram of an LCD according to an exemplary embodiment of the present invention.

FIG. 11 is a block diagram of an LCD according to an exemplary embodiment of the present invention.

As shown in FIG. 11, the LCD includes a liquid crystal panel assembly 300, a data driver 500 connected to the liquid crystal panel assembly 300, a gray voltage generator (not shown) connected to the data driver 500, and a signal controller (not shown) controlling the assembly 300, and the data driver 500.

The liquid crystal panel assembly 300 includes a TFT array panel (not shown) and a common electrode panel (not shown) facing each other, and an LC layer interposed between the two display panels. The TFT array panel includes a display area DA and a control area CA.

In the display area DA, a plurality of gate lines G1-Gn, a plurality of data lines D1-Dm, a plurality of storage electrode lines (not shown), a plurality of pixel electrodes (not shown), and a plurality of TFTs are formed.

In the control area CA, a gate driver generating gate signals and a plurality of signal transmitting lines (not shown) transmitting several kinds of signals from the outside to the gate driver are formed. The gate driver may be a shift register including a plurality of sequentially connected stages (not shown).

A TFT array panel of the LCD shown in FIG. 11 will be described in detail with reference to FIG. 12A to FIG. 13.

Figure 12A:
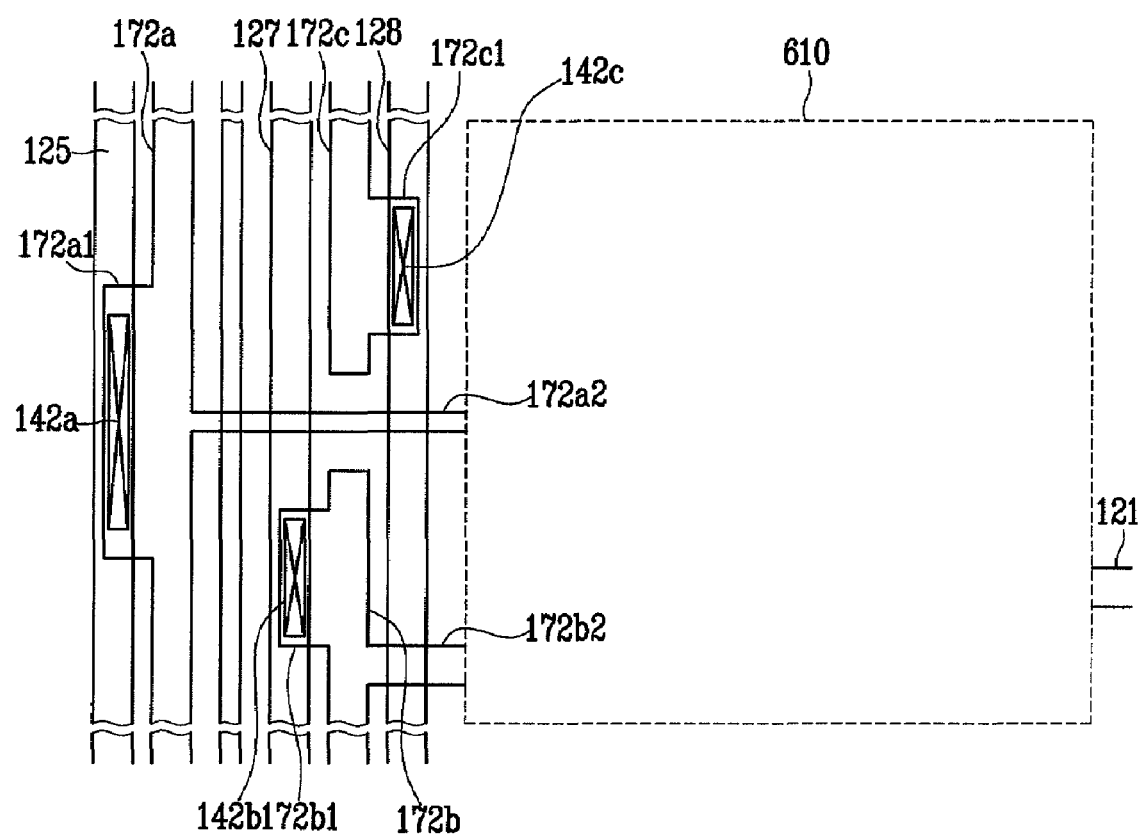
FIG. 12A is a layout view representing a portion of a driving area of the LCD shown in FIG. 11.
Figure 12B:
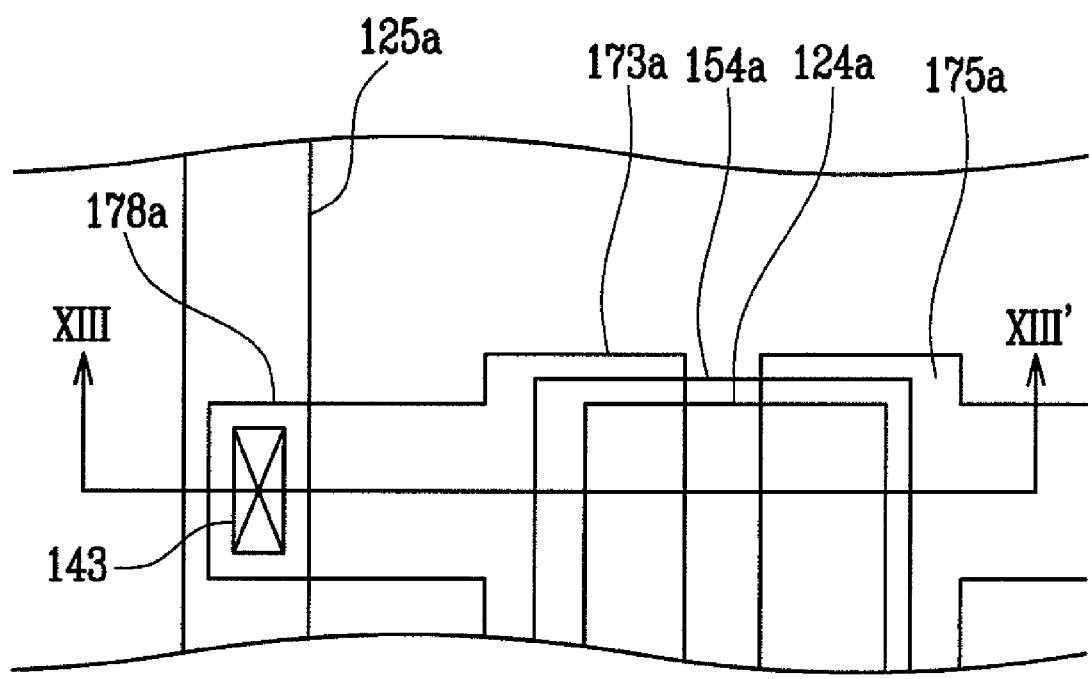
FIG. 12B is a layout view representing a portion of a TFT of the driving area shown in FIG. 12A.
Figure 12C:
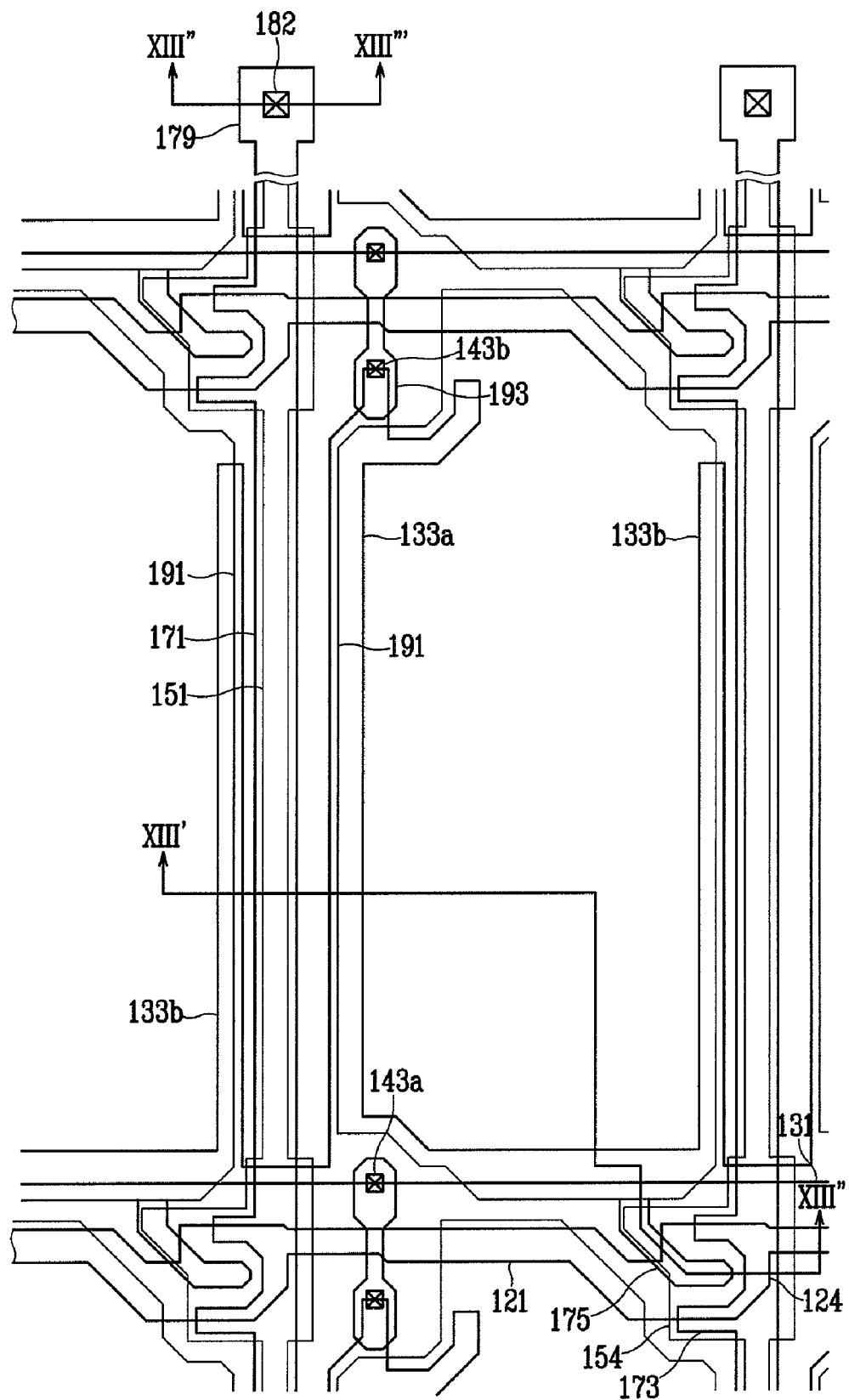
FIG. 12C is a layout view representing a portion of a display area of the LCD shown in FIG. 11.
Figure 13:
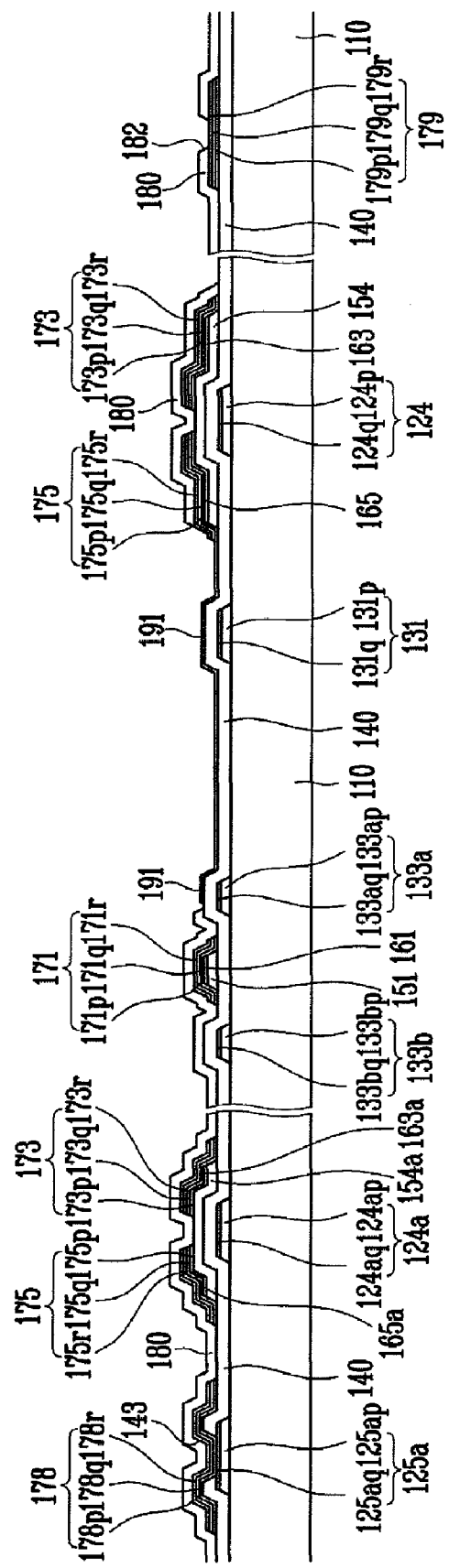
FIG. 13 is a sectional view of the TFT array panel shown in FIG. 12B and FIG. 12C taken along line XIII-XIII'-XIII''-XIII'''.

FIG. 12A is a layout view representing a portion of the driving area of the LCD shown in FIG. 11, FIG. 12B is a layout view representing a portion of a TFT of the driving area shown in FIG. 12A, FIG. 12C is a layout view representing a portion of the display area of the LCD shown in FIG. 11, and FIG. 13 is a sectional view of the TFT array panel shown in FIG. 12B and FIG. 12C taken along line XIII-XIII'-XIII''-XIII'''.

The layered structure of the display area DA is substantially similar to that shown in FIG. 1 and FIG. 2.

Referring to FIG. 12A, the control area CA includes a plurality of circuit portions 610, corresponding to one stage of a shift register, and generating gate signals, and a plurality of signal transmission lines transmitting several kinds of signals. The circuit portion 610 includes a plurality of driving TFTs (not shown) and a plurality of connecting lines (not shown). The TFTs are connected to each other through the connecting lines, and the TFTs are connected to the signal transmitting lines through the connecting lines.

A plurality of gate lines 121 and a plurality of storage electrode lines 131 are formed in the display area DA, and a plurality of gate-layer signal transmission lines 125, 127, and 128, a plurality of gate electrodes 124a of driving thin film transistors, and a plurality of gate-layer signal transmitting lines 125a transmitting signals to the driving thin film transistors in the control area CA are formed on an insulation substrate 110.

Each gate line 121 in the display area DA includes a plurality of gate electrodes 124, and extends to the control area CA to be directly connected thereto, without the need for a gate pad.

The gate-layer signal transmitting lines 125-128 and 125a transmit signals such as voltages for controlling the circuit portion 610 and are input from an external source, and extend substantially in a longitudinal direction.

As shown in FIG. 1 and FIG. 2, the gate lines 121, the storage electrode lines 131, and the gate-layer signal transmission lines 125-128 and 125a have a double-layered structure including a lower layer and an upper layer disposed on the lower layer. In FIG. 13, each lower layer and each upper layer are denoted by additional characters p and q, respectively.

A gate insulating layer 140 is formed on the gate lines 121, the storage electrode lines 131, and the gate-layer signal transmitting lines 125-128, and 125a. The gate insulating layer 140 has a plurality of contact holes 142a, 142b, 142c, and 143 exposing portions of the gate-layer signal transmitting lines 125, 127, 128, and 125a, respectively.

On the gate insulating layer 140, a plurality of semiconductor stripes 151 are formed, and a plurality of ohmic contact stripes 161 including projections 163 and a plurality of ohmic contact islands 165 are formed thereon in the display area DA, and a plurality of semiconductor islands 154a are formed at channels of the driving thin film transistors in the control area CA. A plurality of ohmic contact islands (not shown) may be formed between the semiconductor islands 154a and overlying source electrodes 173a and drain electrodes 175a.

On the ohmic contacts 161 and 165 and the gate insulating layer 140, a plurality of data lines 171, a plurality of drain electrodes 175, a plurality of pixel electrodes 191 that are physically and electrically connected to the drain electrodes 175, and a plurality of overpasses 193 are formed in the display area DA, and a plurality of data-layer signal transmitting lines 172a, 172b, and 172c and a plurality of source electrodes 173a and a plurality of drain electrodes 175a of the driving thin film transistors are formed in the control area CA. The source electrodes 173a of the driving thin film transistors in the control area CA include extensions 178a extending toward the contact holes 143 to connect to the gate-layer signal transmitting lines 125a through the contact holes 143.

The data lines 171 and the drain electrodes 175 in the display area DA, and a plurality of data-layer signal transmitting lines 172a, 172b, and 172c, and source electrodes 173a and drain electrodes 175a of the driving thin film transistors in the control area CA may have a triple-layered structure including a lower layer, an intermediate layer, and an upper layer as shown in FIG. 1 and FIG. 2. In FIG. 13, each lower layer, each intermediate layer, and each upper layer is denoted by additional characters p, q, and r, respectively.

Each of the data lines 171 includes a plurality of source electrodes 173 and a data pad 179.

Like the gate-layer signal transmission lines 125-128, the data-layer signal transmission lines 172a-172c transmit signals such as voltages for controlling the circuit portion 610 that are input from an external source and extend substantially in a longitudinal direction. The data-layer signal transmission lines 172a-172c include a plurality of projections 172a1, 172b1, and 172c1 extending to the contact holes 142a-142c to connect to the gate-layer signal transmission lines 125, 127, and 128 through the contact holes 142a-142c. A portion of the data-layer signal transmission lines 172a and 172b include a plurality of extensions 172a2 and 172b2 extending toward and connecting to the circuit portion 610.

A passivation layer 180 is formed on the data lines 171, the drain electrodes 175, the data-layer signal transmitting lines 172a-172c, and the exposed portions of the semiconductor stripes 151. The passivation layer 180 has plurality of contact holes 182 exposing portions of the data pads 179.

Accordingly, the gate-layer signal transmission lines 125, 127, 128, and 125a made of an Al-containing metal and the data-layer signal transmission lines 172a-177c and 178a made of a refractory metal may be directly connected to each other without additional connecting members made of a transparent conductor such as ITO or IZO through the contact holes 142a-142c, and 143, and the data-layer signal transmission lines 172a-177c and 178a may completely cover the contact holes 142a-142c and 143 such that oxidation and corrosion of Al or an Al alloy that may occur by direct contact with ITO or IZO may be prevented.

A manufacturing method of the TFT array panel shown in FIG. 12B to FIG. 13 according to the an exemplary embodiment of the present invention will be described in detail with reference to FIG. 14 to FIG. 18D along with FIG. 12B to FIG. 13. FIG. 14 to FIG. 18E are layout views of the TFT array panel shown in FIG. 12B and FIG. 12C in intermediate steps of a manufacturing method thereof according to an exemplary embodiment of the present invention.

Figure 14:
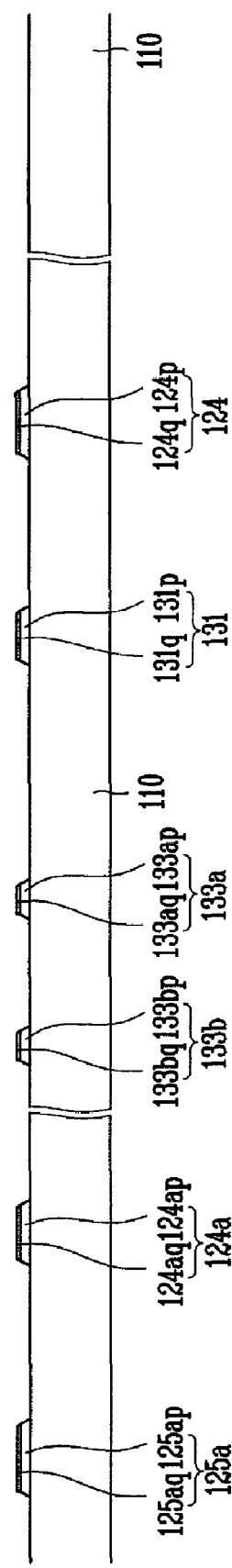
FIG. 14 to FIG. 18E are layout views of the TFT array panel shown in FIG. 12B and FIG. 12C in steps of a manufacturing method thereof according to an exemplary embodiment of the present invention.

Referring to FIG. 14, a lower conductive layer and an upper conductive layer are sequentially deposited and patterned by photolithography and etching to form a plurality of gate lines 121 and a plurality of storage electrode lines 131 having a double-layered structure.

Referring to FIG. 14, a lower conductive layer and an upper conductive layer are sequentially deposited on an insulation substrate 110 and patterned by photolithography and etching to form a plurality of gate lines 121 including gate electrodes 124 and gate pads 129 and a plurality of storage electrode lines 131 including storage electrodes 133a and 133b in a display area DA, and to form a plurality of gate-layer signal transmitting lines 125, 127, 128, and 125a, and a plurality of gate electrodes 124a of driving thin film transistors in a control area CA. The gate lines 121, the storage electrode lines 131, the gate-layer signal transmitting lines 125-128 and 125a, and the gate electrodes 124a of the driving thin film transistors have a double-layered structure having a lower layer and an upper layer, and the upper layer and the lower layer are denoted by additional characters p and q, respectively in the drawings.

Figure 15:
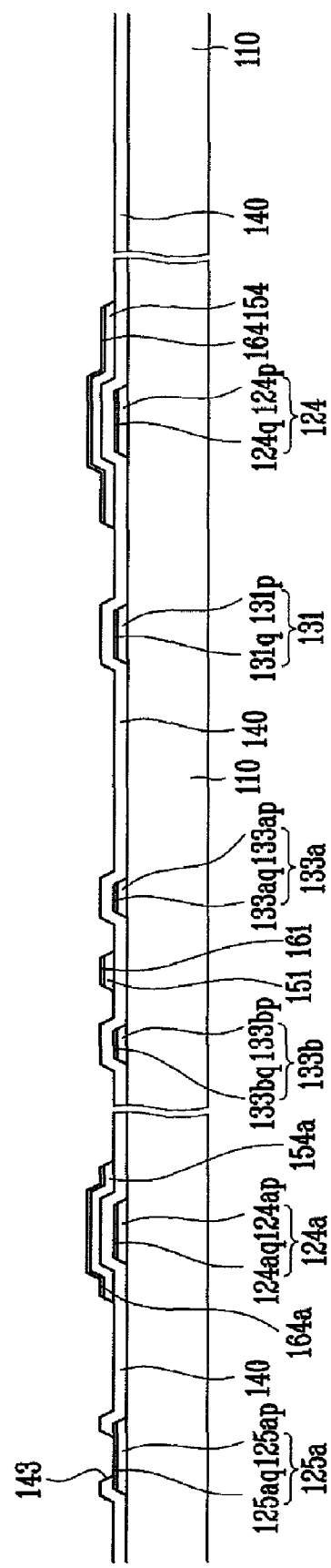

Next, a gate insulating layer 140 having a plurality of contact holes 142a-142c, and 143 a plurality of (intrinsic) semiconductor stripes 151 including projections 154 and a plurality of extrinsic semiconductor stripes 161 including projections 164 are formed in a display area DA, and a plurality of (intrinsic) semiconductor islands 154a and a plurality of extrinsic semiconductor islands 164 are formed in a control area CA as shown in FIG. 15.

The formation of the TFT array panel shown in FIG. 15 will be described in more detail with reference to FIG. 16A to FIG. 16F.

Figure 16A:
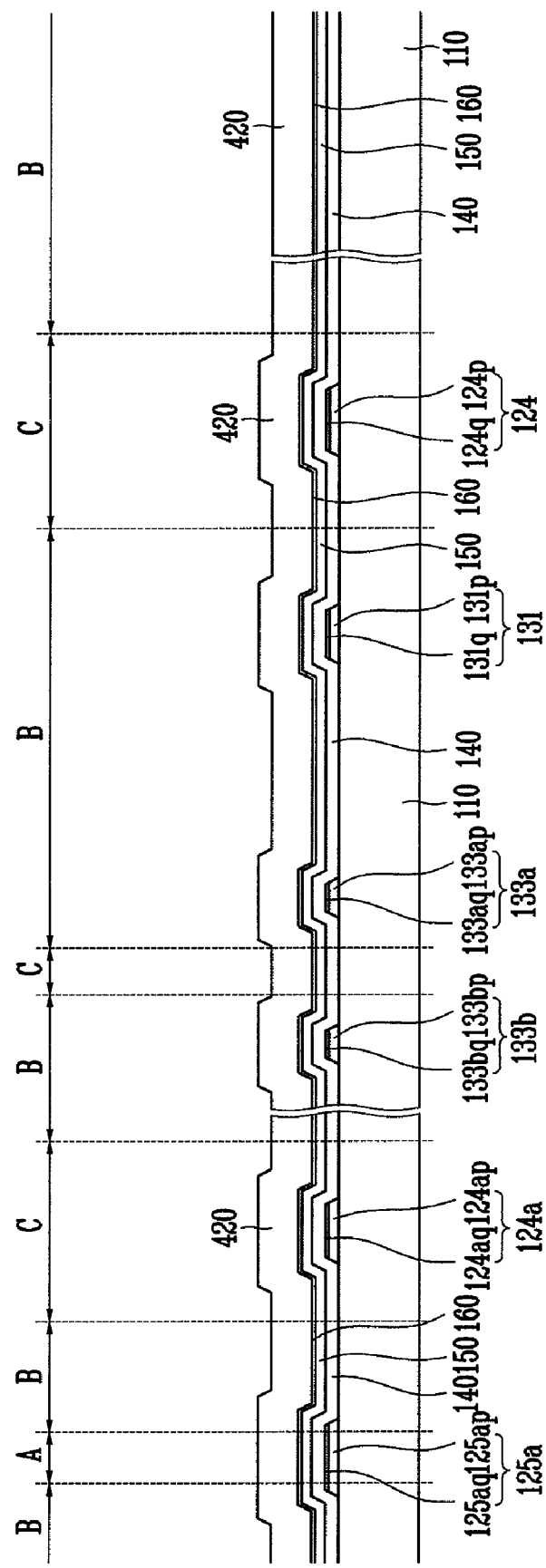

Referring to FIG. 16A, the gate insulating layer 140, an intrinsic layer 150, and an extrinsic layer 160 may be sequentially deposited on the substrate by plasma enhanced chemical vapor deposition (PECVD) and then a photoresist film 420 is coated thereon. The intrinsic layer 150 and extrinsic layer may be made of a material such as, for example, a Si.

Figure 16B:
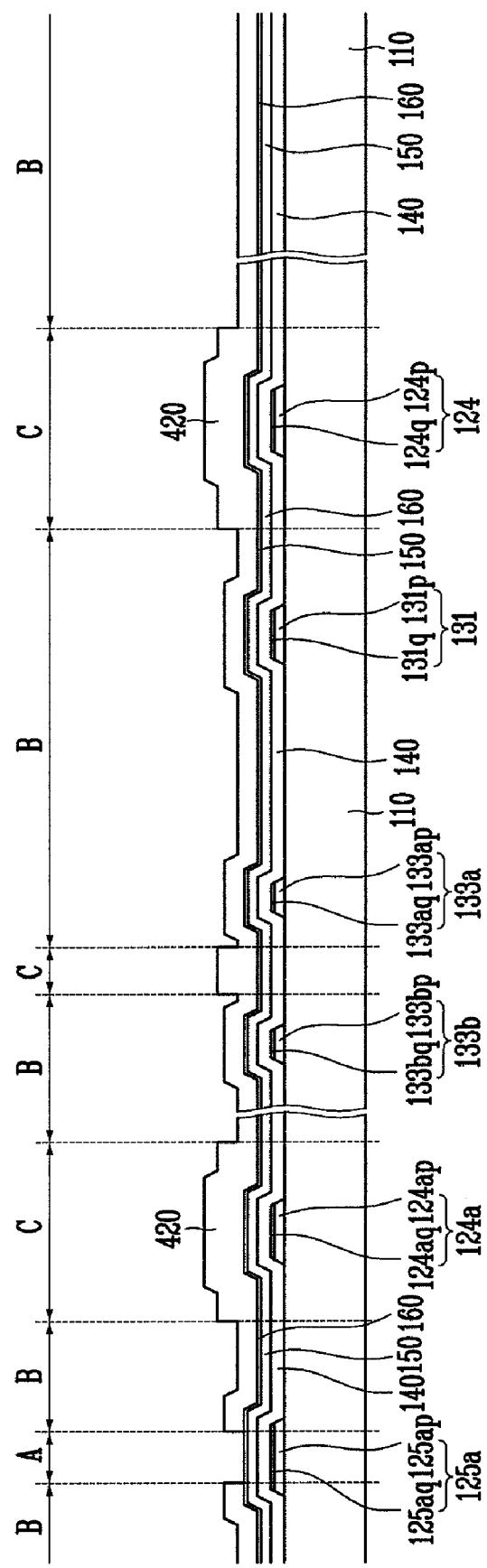

Next, the photoresist film 420 is exposed through an exposure mask having light transmitting transparent areas A, translucent areas B, and light blocking opaque areas C, and then the exposed photoresist film 420 is developed. As shown in FIG. 16B, the developed photoresist film 420 has a position-dependent thickness such that the photoresist film 420 located in the light transmitting transparent area A is removed, that the thickness of the photoresist film 420 located in the translucent areas B is reduced, and that the photoresist film 420 located in the light blocking opaque areas C is not removed.

Figure 16C:
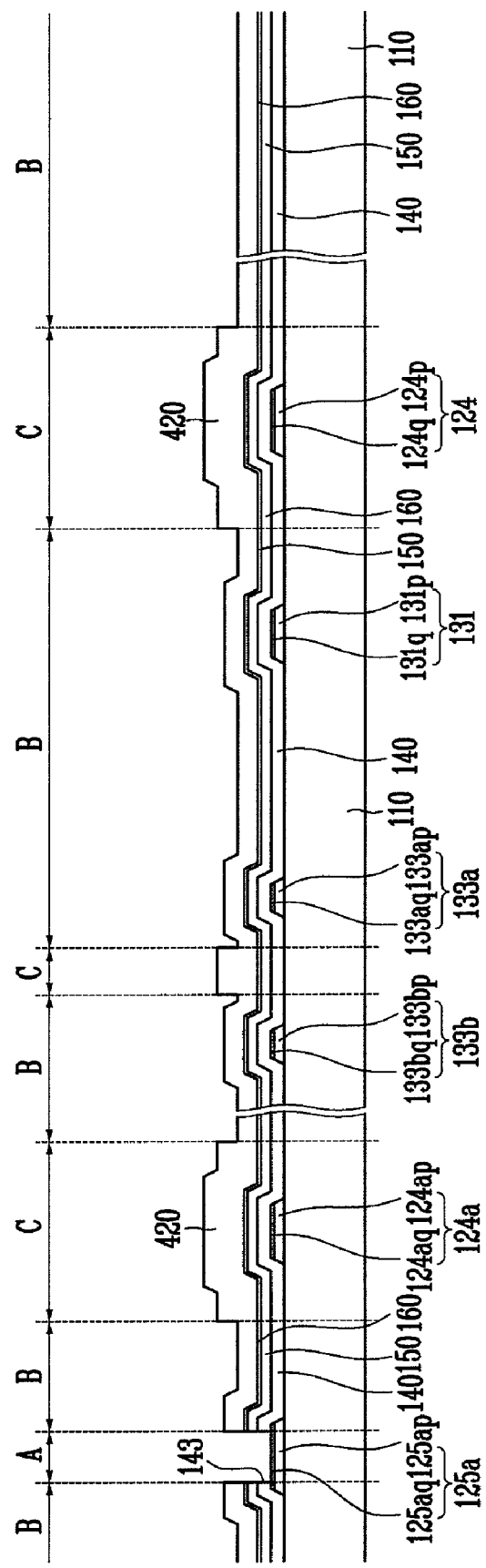

Next, the extrinsic layer 160, the intrinsic a-Si layer 150, and the gate insulating layer 140 are etched using the remaining photoresist film 420 as a mask to remove the extrinsic layer 160, the intrinsic layer 150 and the gate insulating layer 140 located in the light transmitting transparent area A such that the contact holes 142a-142c and 143 exposing portions of the gate-layer signal transmitting lines 125, 127, 128, and 125a are formed in the gate insulating layer 140 as shown in FIG. 16C.

Figure 16D:
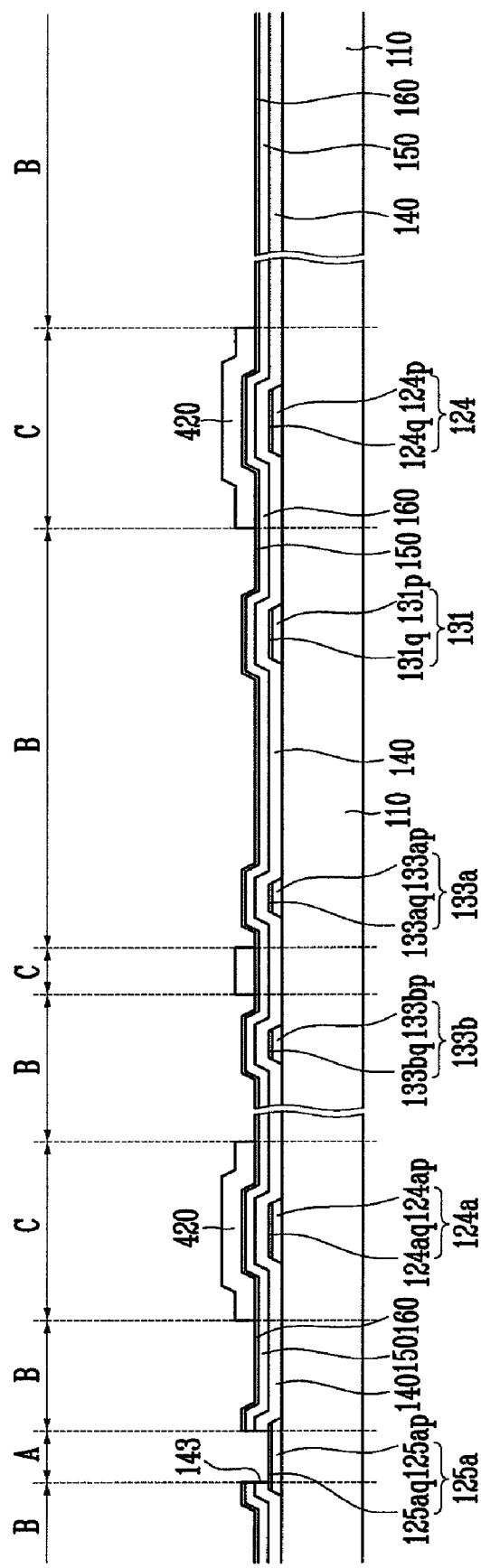

As shown in FIG. 16D, ashing may be performed on the photoresist film 420 such that the photoresist film 420 disposed in the translucent areas B is removed and the thickness of the photoresist film 420 disposed in the light blocking opaque areas C is reduced.

Figure 16E:
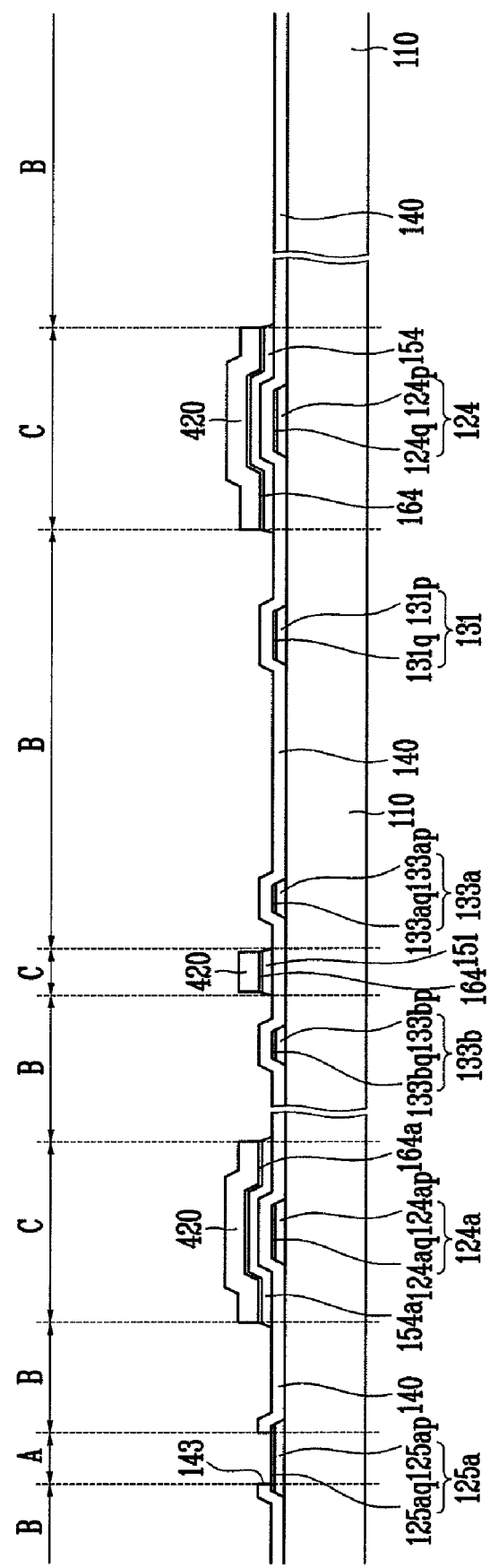

Referring to FIG. 16E, the extrinsic layer 160 and the intrinsic layer 150 are etched using the remaining photoresist film 420 located in the light blocking opaque areas C as a mask to form the extrinsic semiconductor stripes 161 including projections 164 and the intrinsic semiconductor stripes 151 including projections 154 in the display area DA, and to form a plurality of (intrinsic) semiconductor islands 154a and a plurality of extrinsic semiconductor islands 164 in control area CA.

Figure 16F:
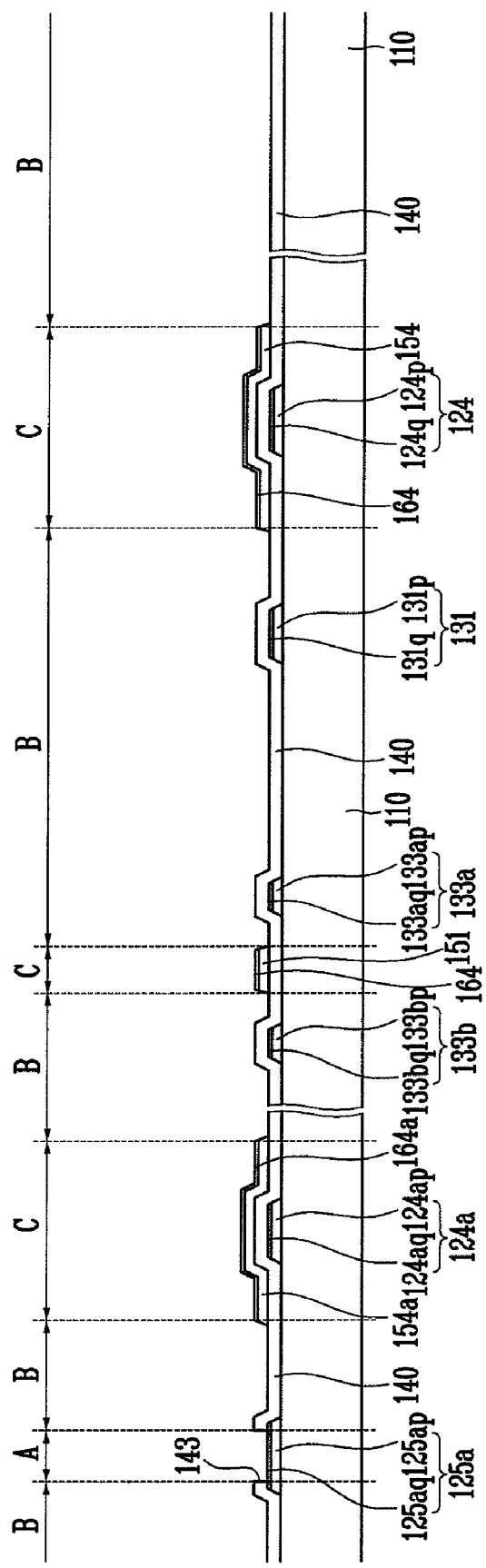

Finally, the remaining photoresist film 430 located in the light blocking opaque areas C may be removed by ashing as shown in FIG. 16F.

Figure 17:
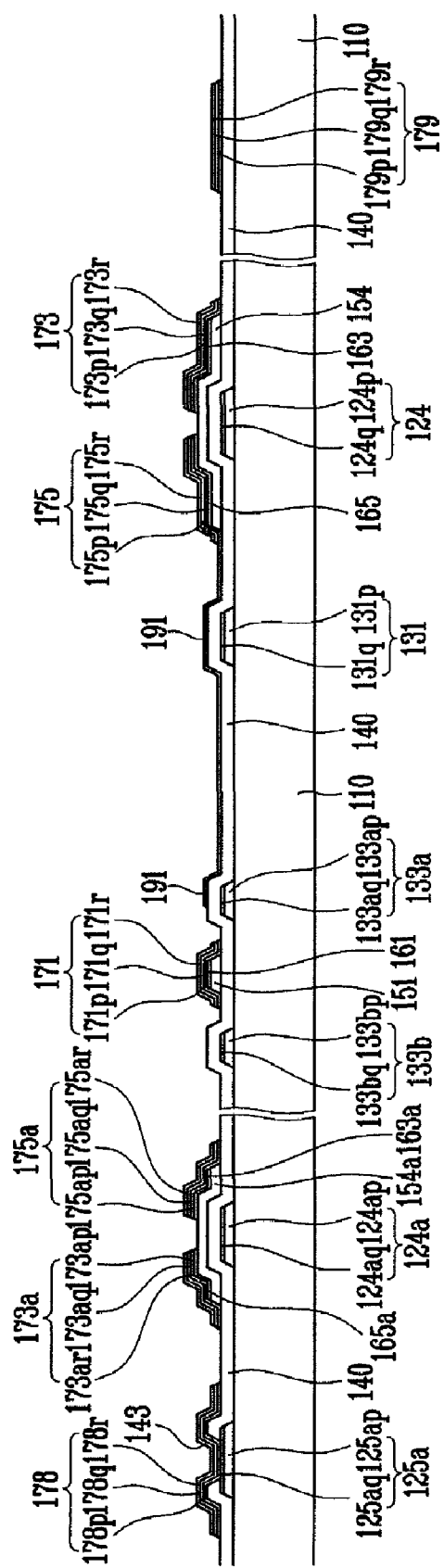

Referring to FIG. 17, a plurality of data lines 171 including source electrodes 173 and data pads 179, a plurality of drain electrodes 175, a plurality of pixel electrodes 191, and a plurality of overpasses 193 are formed in the display area DA, and a plurality of data-layer signal transmitting lines 172a, 172b, and 172c and a plurality of source electrodes 173a including extensions 178a and a plurality of drain electrodes 175a of the driving thin film transistors are formed in the control area CA. Here, projections 172a1, 172b1, and 172c1 of the data-layer signal transmitting lines 172a, 172b, and 172c are directly connected to the exposed gate-layer signal transmission lines 125, 127, and 128 through the contact holes 142a-142c, and the extensions 178a of the source electrodes 173a are directly connected to the exposed gate-layer signal transmitting lines 125a through the contact holes 143.

The formation of the TFT array panel shown in FIG. 17 will be described in more detail with reference to FIG. 18A to FIG. 18E.

Figure 18A:
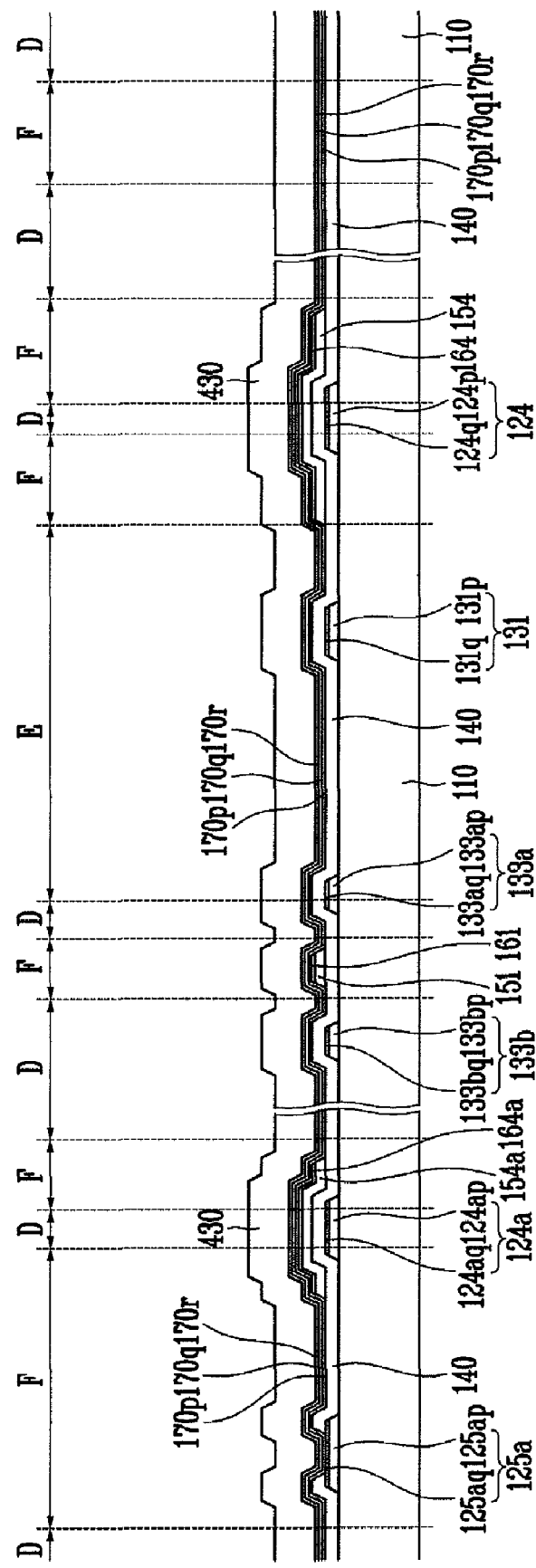

Referring to FIG. 18A, a lower conductive layer 170p made of a transparent conductive material such as, for example, a-ITO, ITO, and IZO, an intermediate conductive layer 170q made of a refractory metal such as, for example, Cr, Mo, Ta, and Ti, and an upper conductive layer 170r made of a transparent conductive material such as, for example, a-ITO, ITO, and IZO are sequentially deposited on the extrinsic semiconductor stripes 161 and 164 and the gate insulating layer 140, and then a photoresist film 430 is coated thereon.

Figure 18B:
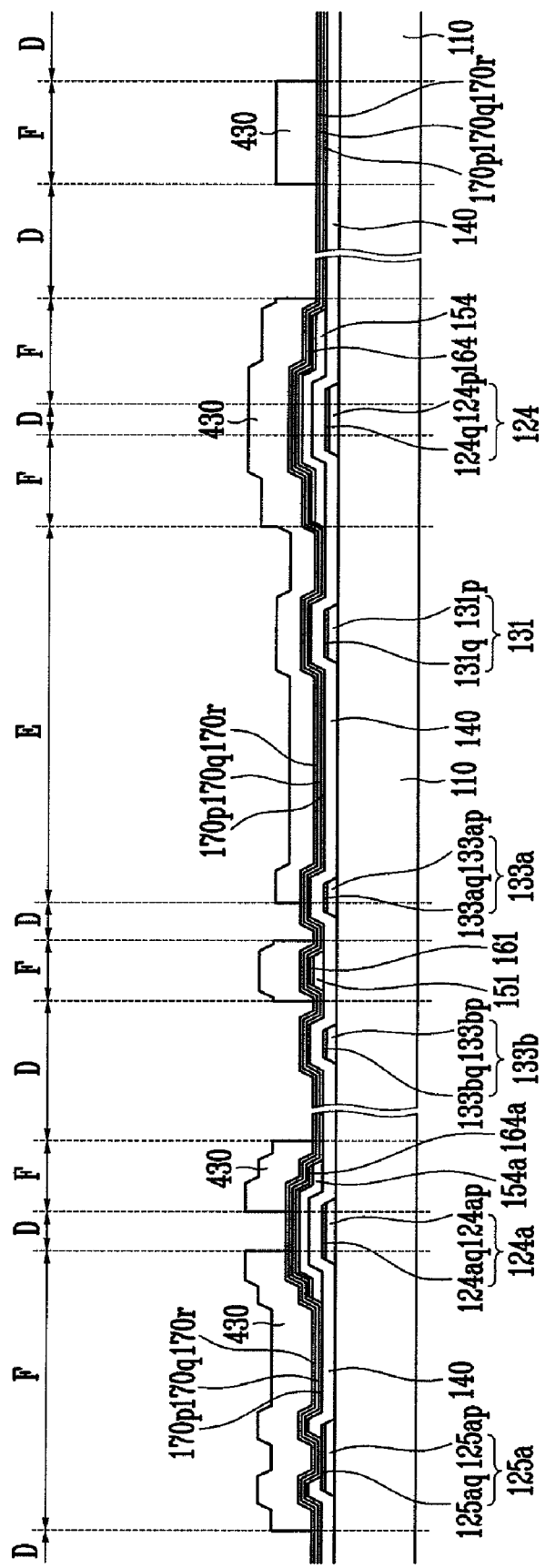

Next, the photoresist film 430 is exposed through an exposure mask having light transmitting transparent areas D, translucent areas E, and light blocking opaque areas F, and then the exposed photoresist film 430 is developed. As shown in FIG. 18B, the developed photoresist film 430 has a position-dependent thickness.

Figure 18C:
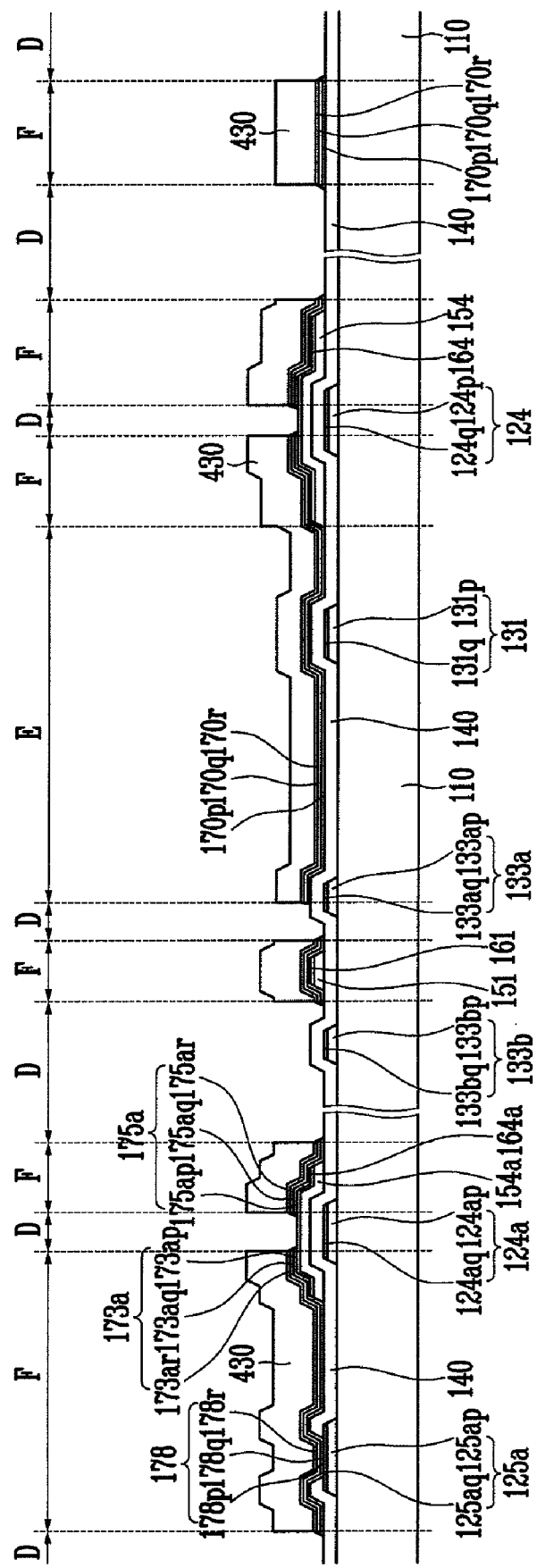
Figure 18D:
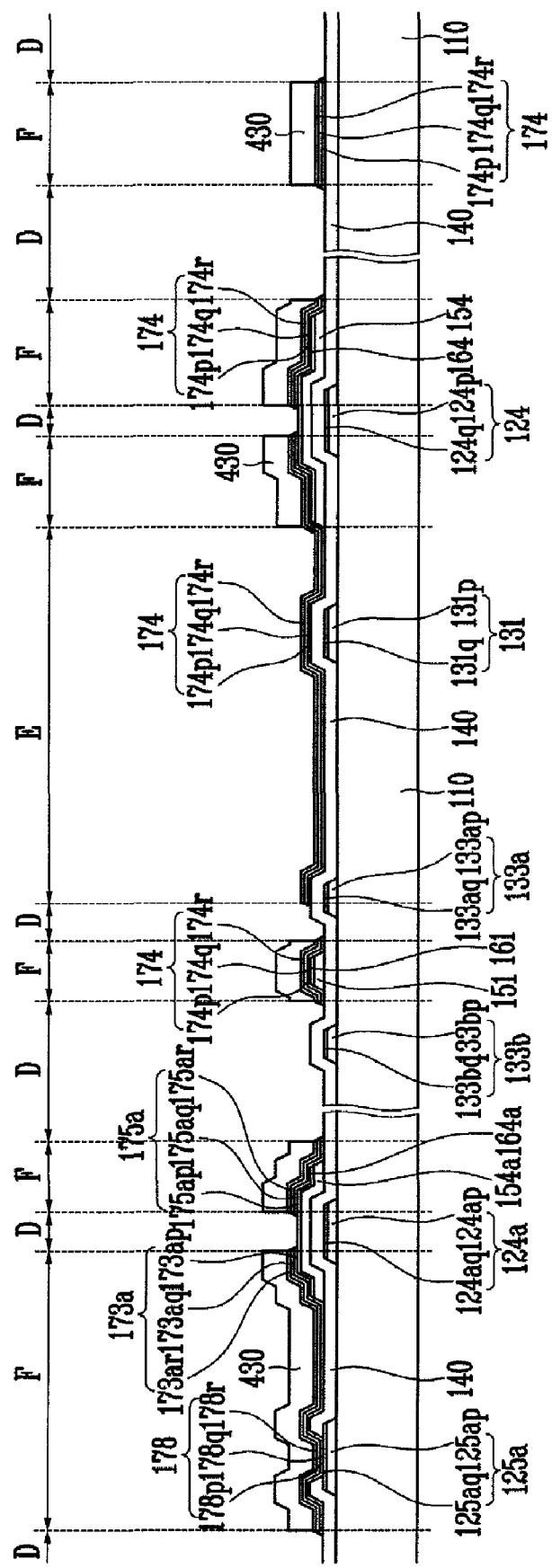
Figure 18E:
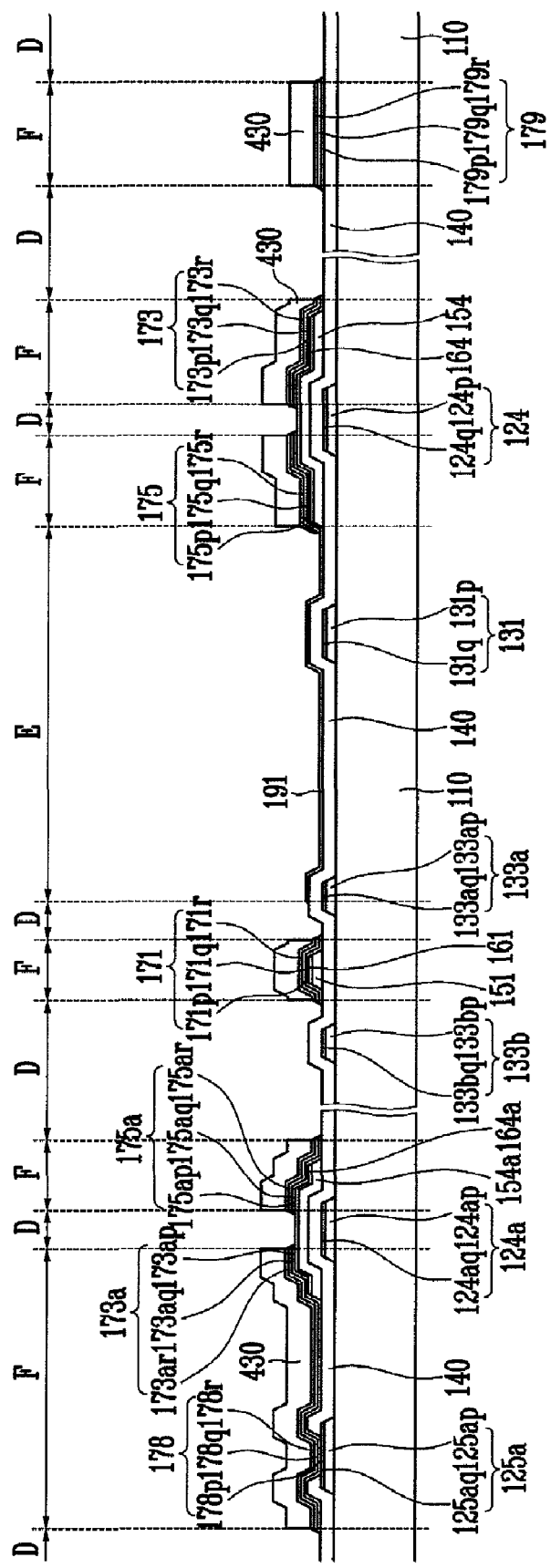

The upper conductive layer 170r, the intermediate conductive layer 170q, and the lower conductive layer 170p are sequentially etched using the remaining photoresist film 430 as a mask to remove the upper conductive layer 170r, the intermediate conductive layer 170q, and the lower conductive layer 170p located in the light transmitting transparent areas D such that a plurality of data conductors 174 including a lower conductor 174p, an intermediate conductor 174q, and an upper conductor 174r are formed in the display area DA, and a plurality of data-layer signal transmitting lines 172a, 172b, and 172c and a plurality of source electrodes 173a and a plurality of drain electrodes 175a of a plurality of driving thin film transistors are formed in the control area CA as shown in FIG. 18C As shown in FIG. 18D, ashing may be performed on the photoresist film 430 such that the photoresist film 430 disposed in the translucent areas E is removed and the thickness of the photoresist film 430 disposed in the light blocking opaque areas F is reduced. Next, the upper conductor 174r and the intermediate conductor 174q are sequentially etched using the remaining photosensitive film 430 located in the light blocking opaque areas F as a mask such that the lower conductor 174p remains in the translucent areas E to form a plurality of data lines 171 including source electrodes 173, and a plurality of drain electrodes 175 in the display area DA, and at substantially the same time to form a plurality of pixel electrodes 191 and a plurality of overpasses 193 including the lower conductor 174p as shown in FIG. 18E.

Thereafter, exposed portions of the extrinsic semiconductors 164, which are not covered with the data lines 171 and the drain electrodes 175, are removed to complete a plurality of ohmic contact stripes 161 including projections 163 and a plurality of ohmic contact islands 165 and to expose portions of the intrinsic semiconductor stripes 151 in the display area DA. In addition, exposed portions of the extrinsic semiconductors 164a, which are not covered with the source electrodes 173a and the drain electrodes 175a, are removed to complete a plurality of ohmic contact islands 163a and 165a to expose portions of the intrinsic semiconductor islands 154a in the control area CA.

Finally, a passivation layer 180 is deposited and patterned by photolithography (and etching) to expose the pixel electrodes 191 and the overpasses 193, and to form a plurality of contact holes 182 exposing the data pads 179 as shown in FIG. 13.

As described above, according to at least one embodiment of the present invention, the contact holes in the gate insulating layer 140 and the extrinsic semiconductor stripes 161 and the intrinsic semiconductor stripes 151 are formed at substantially the same time, and the exposed gate pads through the contact holes are covered by the interconnection members made of the same material as the data lines or the exposed gate pads through the contact holes are directly connected to the data-layer signal transmitting lines such that oxidation and corrosion of Al or an Al alloy that may occur by direct contact with ITO or IZO may be prevented. In addition, the pixel electrodes may be formed with the contact assistants and the data lines using one mask such that an additional exposure mask is not required, thereby reducing production cost.

Having described exemplary embodiments of the present invention, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
a substrate;
a gate line and a gate-layer signal transmitting line of a gate driving circuit portion formed on the substrate;
a gate insulating layer formed on the gate line and the gate-layer signal transmitting line and having a first contact hole exposing a portion of the gate-layer signal transmitting line;
a semiconductor layer formed on the gate insulating layer;
a data line including a source electrode, and a drain electrode formed on the gate insulating layer and the semiconductor layer;
a data-layer signal transmitting line of the gate driving circuit portion formed on the gate insulating layer and connected to the gate-layer signal transmitting line through the first contact hole;
a pixel electrode connected to the drain electrode; and
a passivation layer formed on the data line, the drain electrode, and the data-layer signal transmitting line of the driving circuit portion,
wherein the data line, the drain electrode, and the data-layer signal transmitting line have a triple-layered structure including a lower layer, an intermediate layer, and an upper layer, and the lower layer is made of a same layer as the pixel electrode.

2. The thin film transistor array panel of claim 1, wherein the data-layer signal transmitting line includes a source electrode of a driving thin film transistor of the gate driving circuit portion.

3. The thin film transistor array panel of claim 1, wherein the lower layer and the upper layer include amorphous indium tin oxide, indium tin oxide, or indium zinc oxide, and the intermediate layer includes chromium, molybdenum, tantalum, or titanium.

4. The thin film transistor array panel of claim 1, wherein the gate line and the gate-layer signal transmitting line include a lower layer including chromium, a chromium-nitrogen alloy, or molybdenum, and an upper layer including aluminum or an aluminum alloy.

5. A thin film transistor array panel, comprising:
a substrate;
a gate line formed on the substrate and including a gate pad for contact with an external driving circuit;
a gate insulating layer formed on the gate line having a first contact hole exposing a portion of the gate pad;
a semiconductor layer formed on the gate insulating layer;
a data line including a source electrode, and a drain electrode formed on the gate insulating layer and the semiconductor layer;
a conductor formed on the gate insulating layer and connected to the gate pad through the first contact hole;
a pixel electrode connected to the drain electrode; and
a passivation layer formed on the data line, the drain electrode, and the conductor, and having a second contact hole exposing the conductor,
wherein the data line, the drain electrode, and the conductor have a triple-layered structure including a lower layer, an intermediate layer, and an upper layer, and the lower layer is made of a same layer as the pixel electrode.

6. The thin film transistor array panel of claim 5, wherein the lower layer and the upper layer include amorphous indium tin oxide, indium tin oxide, or indium zinc oxide, and the intermediate layer includes chromium, molybdenum, tantalum, or titanium.

7. The thin film transistor array panel of claim 5, wherein the gate line includes a lower layer including chromium, a chromium-nitrogen alloy, or molybdenum and an upper layer including aluminum or an aluminum alloy.

* * * * *